(12) United States Patent
Hunt et al.

(10) Patent No.: US 6,869,484 B2
(45) Date of Patent: Mar. 22, 2005

(54) CONTINUOUS FEED COATER

(75) Inventors: Andrew T. Hunt, Atlanta, GA (US); Wayne Neilson, Vista, CA (US); Miodrag Oljaca, Avondale Estates, GA (US); Edward J. Reardon, Laguna Niguel, CA (US); Tzyy-Jiuan Jan Hwang, Alpharetta, GA (US); William D. Danielson, Jr., Decatur, GA (US); James D. Huggins, Atlanta, GA (US); David E. Bane, Lawrenceville, GA (US); Ian H. Campbell, Moreland, GA (US); Yibin Xue, Norcross, GA (US)

(73) Assignee: Shipley Company, L.L.C., Marlborough, MA (US)

( * ) Notice: Subject to any disclaimer, the term of this patent is extended or adjusted under 35 U.S.C. 154(b) by 162 days.

(21) Appl. No.: 09/952,881

(22) Filed: Sep. 15, 2001

(65) Prior Publication Data

US 2002/0069826 A1 Jun. 13, 2002

Related U.S. Application Data

(60) Provisional application No. 60/233,022, filed on Sep. 15, 2000, and provisional application No. 60/249,979, filed on Nov. 20, 2000.

(51) Int. Cl.⁷ ........................... C23C 16/00; C23C 14/00
(52) U.S. Cl. ................... 118/718; 204/298.24
(58) Field of Search ............... 204/298.24; 118/718

(56) References Cited

U.S. PATENT DOCUMENTS

| | | | | |
|---|---|---|---|---|
| 3,850,679 A | * | 11/1974 | Sopko et al. | 427/255.19 |
| 3,907,607 A | | 9/1975 | Chu et al. | |
| 4,031,851 A | * | 6/1977 | Camahort | 118/718 |
| 4,423,701 A | * | 1/1984 | Nath et al. | 118/715 |

(List continued on next page.)

FOREIGN PATENT DOCUMENTS

| | | | |
|---|---|---|---|
| DE | 197 44 060 A1 | 4/1999 | |
| EP | 0 450 760 A1 | 10/1991 | |
| EP | 0 663 458 A1 | 7/1995 | |
| EP | 0 976 847 A2 | 2/2000 | |
| JP | 63 057777 | 3/1988 | |
| JP | 01224206 A | * 9/1989 | ........... C01B/13/14 |
| JP | 08 081778 | 3/1996 | |

OTHER PUBLICATIONS

Patent Abstracts of Japan, vol. 012, No. 279 (C–517), Aug. 1, 1998 & JP 63 057777 A (Canon Inc.), Mar. 12, 1988.
Patent Abstracts of Japan, vol. 1996, No. 07, Jul. 31, 1996 & JP 08 081778 A (Yuuha Mikakutou Seimitsu Kogaku Kenkyusho:KK; Mori Yuzo), Mar. 26, 1996.

*Primary Examiner*—Parviz Hassanzadeh
*Assistant Examiner*—Karla Moore
(74) *Attorney, Agent, or Firm*—S. Matthew Cairns

(57) ABSTRACT

A continuous feed coater for coating a length of substrate with vaporized or sprayed material, is disclosed. A specific example is a roll-to-roll coater which includes two lower supply rollers for supporting two webs of uncoated material, and two upper take-up rollers for supporting the webs after they are coated. A central web-support forms a plenum that acts as a deposition chimney or chamber by bringing the two webs into close proximity to each other to form two large walls of the plenum. The ends of the webs are sealed using side dams to form the chimney with a rectangular cross section such that the vapor cannot exit from the edges of the material. The vaporized coating constituents to be deposited on the rolled material are directed into the deposition plenum from a coating material supply source located at the bottom of the plenum, and are exhausted through the top of the plenum. By providing a plenum having two large surface area walls formed of the material to be coated, an extremely efficient coating system is provided. The top of the plenum includes an exhaust system with an orifice plate with a plurality of orifices spaced across the width of the deposition plenum. These orifices restrict gas exhaust to provide the gas and vapor residence time for the materials being used.

41 Claims, 10 Drawing Sheets

U.S. PATENT DOCUMENTS

| | | | |
|---|---|---|---|
| 4,601,260 A | * | 7/1986 | Ovshinsky ................... 118/718 |
| 4,627,989 A | * | 12/1986 | Feuerstein et al. ............ 427/10 |
| 4,635,586 A | * | 1/1987 | Diener et al. ................ 118/718 |
| 4,664,951 A | * | 5/1987 | Doehler ................... 427/248.1 |
| 4,723,507 A | | 2/1988 | Ovshinsky et al. |
| 4,728,406 A | | 3/1988 | Banerjee et al. |
| 5,236,509 A | * | 8/1993 | Sioshansi et al. ........... 118/719 |
| 5,314,570 A | * | 5/1994 | Ikegaya et al. .............. 117/103 |
| 5,344,500 A | | 9/1994 | Sasaki et al. |
| 5,364,481 A | * | 11/1994 | Sasaki et al. ................ 118/718 |
| 6,093,253 A | * | 7/2000 | Lofgren et al. ............. 118/725 |
| 6,488,777 B2 | * | 12/2002 | Madan et al. ................ 118/718 |
| 2003/0134051 A1 | * | 7/2003 | Jung et al. ................... 427/444 |

* cited by examiner

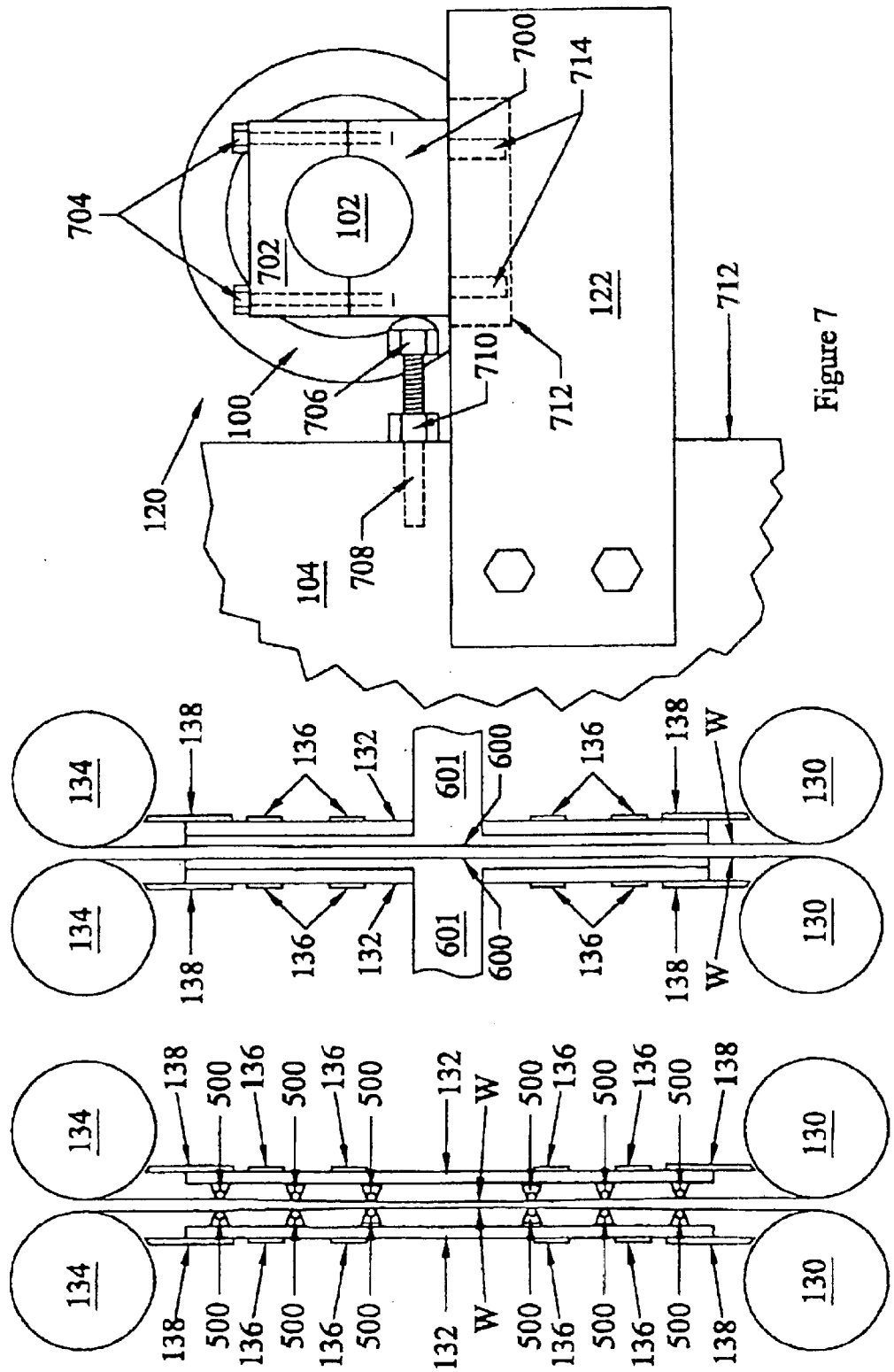

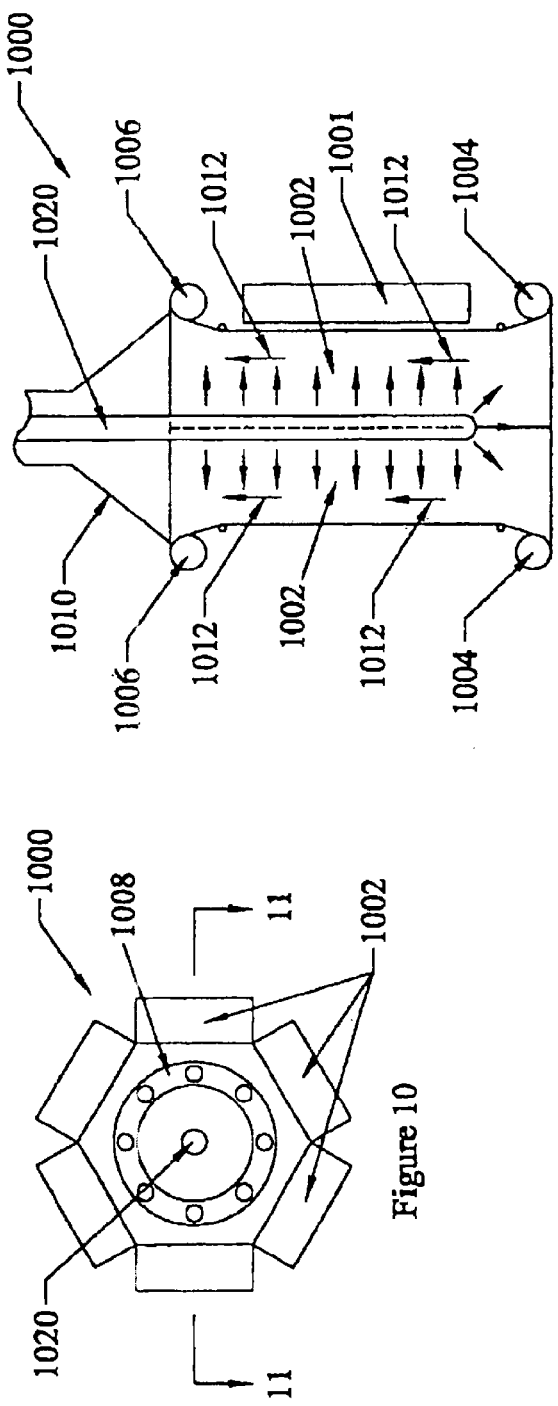
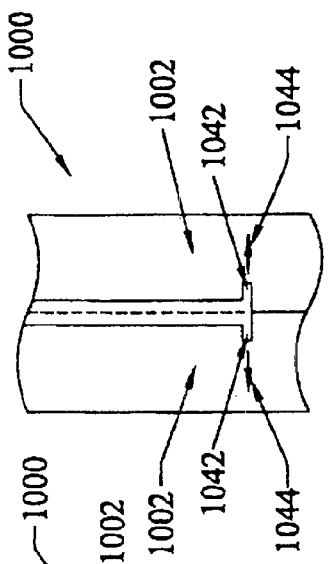
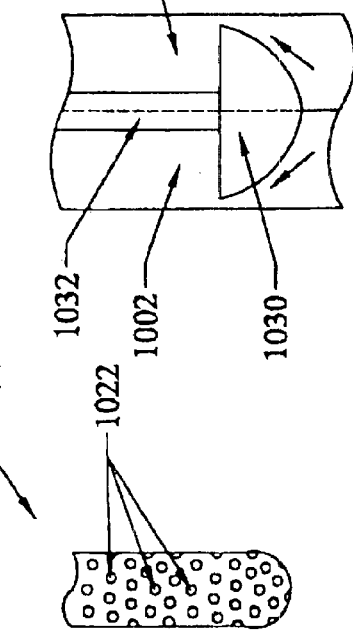
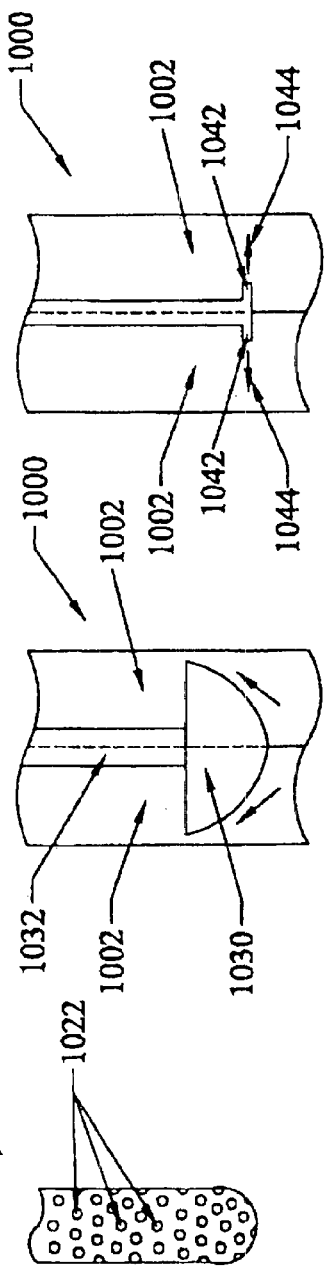

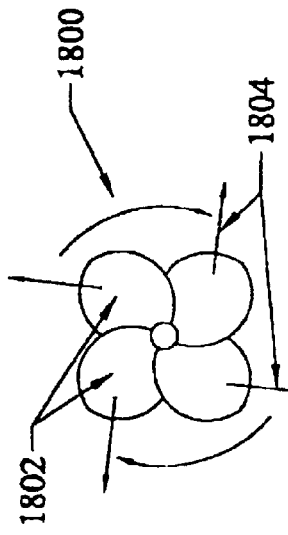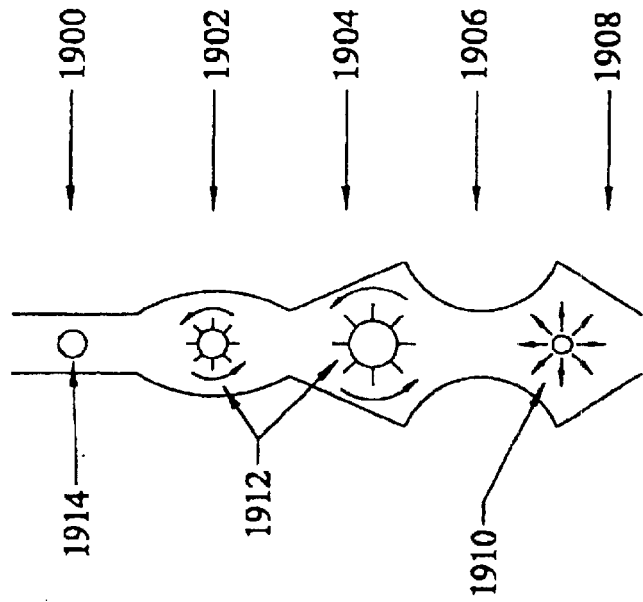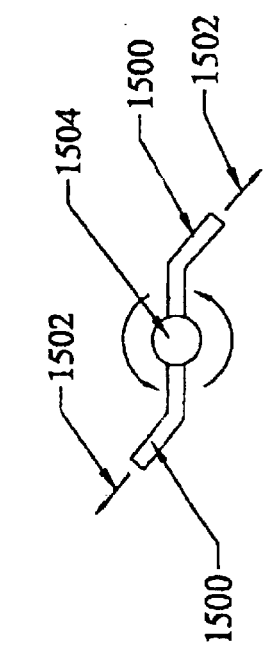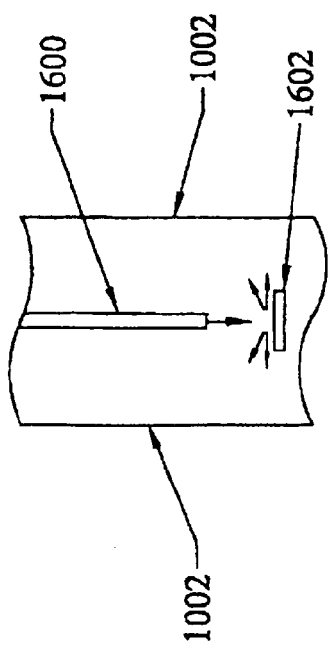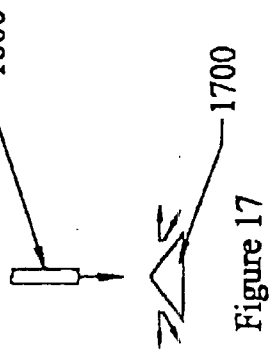

CONTINUOUS FEED COATER

This application claims the benefit of U.S. Provisional Application(s) and No(s).; 60/233,022 filed Sep. 15, 2000 and 60/249,979 filed Nov. 20, 2000.

FIELD OF THE INVENTION

The present invention is directed to methods and devices for forming thin films and coatings on sequentially fed substrates. In particular, the invention is directed to maximizing the efficiency of the coating process by increasing the effective area of deposition using a roll-to-roll or other sequential feed mechanism to expose a portion of a substrate, web or rolled sheet to the deposition species, and then advancing the substrate(s) to form the desired coating thickness and uniformity.

BACKGROUND OF THE INVENTION

Spraying and vapor deposition have been used for many years to produce coatings on substrates by producing a mist or vapor of the deposited material and then exposing a surface of the substrate to the vapor to thereby form the desired coating. In order to conserve the deposited material, and to avoid contaminating the surrounding area, a chamber is used to surround the substrate. In many methods the chamber must be evacuated to provide an oxygen-free or reduced atmosphere to avoid a combustible mixture or the early reaction of the precursor. During the deposition process, the coating material may deposit on the walls of the chamber, producing waste material that must be collected for reuse or disposed of. Other waste is produce by the material that is removed from the chamber by the ventilation system.

In chemical vapor deposition (CVD), vapor may be produced in a bubbler or other device that subjects the precursor materials to an energy source to activate the precursor and form the coating material, and then this material (in vapor form) is routed to the substrate. More recently developed CVD methods include combustion chemical vapor deposition (CCVD), as described in U.S. Pat. Nos. 5,652,021, 5,858,465, 5,863,604, 5,997,956 and 6,013,318, the disclosures of which are hereby incorporated by reference. In these patents a combustion source is used to provide the energy source to activate the precursor material (and possibly heat the substrate as well) in the vicinity of the substrate surface. This eliminates the need for a chamber and increases efficiency of the deposition process by producing the coating material close to the substrate so that a majority of the material is deposited on the desired surface of the substrate. Of course, a chamber or hood may still be desired depending on the specific application.

Regardless of the coating method used, what is missing in the prior art is a higher efficiency method of coating a large surface area of a substrate in a continuous manner. This is necessary to provide a practical solution for large-scale production of coated materials at reduced costs and reduced production of solid wastes. One example is CVD, wherein normal deposition efficiencies are 5 to 30%. Higher deposition efficiencies are desired to lower costs, increase deposition rates and be environmentally sensitive by reducing waste material.

SUMMARY OF THE INVENTION

The present invention involves the use of a single or multi-faced coating machine that is particularly suited to deposition of coatings on continuously or intermittently fed substrates. These substrates may be in the form of several different types of continuous or connected substrates and include but are not limited to: flexible substrates such as continuous strings, sheets, wires, tubes, fiber optic cables, strips or tapes (such as superconducting tapes); or more rigid substrates such as plates, rods, tubes, and elongated substrates, wherein these rigid substrates being interconnected or conveyor driven to supply a continuous feed of substrate material. When the substrates are continuously fed in the form of flexible material such as wire, strip or sheet material, these may be supported on a roll. One example of sheet material is copper foil, such as is used in the electronics industry for eventually forming circuitry on a printed wiring board (PWB). Although it should be understood that the below-described roll-to-roll coater embodiment of the present invention can be used to form coatings on a wide range of sheet materials. These materials include but are not limited to: metal foils, such as aluminum, copper, stainless steel and nickel; plastics, including thermal setting (thermosets) and thermoplastics; and other materials, such as epoxy-glass or Kapton® (a polyimide film produced by Dupont®).

The invention forms a deposition plenum which is a deposition chamber formed in part by the substrates to be coated. By bringing substrate material together into close proximity to each other or another surface, at least one wall of the plenum chamber is provided. The side edges of the webs or substrates contact each other to form an enclosing web system or are otherwise sealed using side dams to form the plenum with a multi-sided cross section such that the vapor cannot exit from the edges of the material. The roll-to-roll embodiment of the machine has two or more sets of supply and take-up rollers for advancing multiple webs to present non-coated surfaces to the interior of the chamber while advancing coated surfaces out of the chamber. In order to bring the webs in close proximity to each other, the material of the supply rolls is fed through positioning rollers and a web-handling portion and finally to the take-up rollers. The coating constituents to be deposited on the rolled material are directed into the deposition plenum from a coating material supply source located at the bottom of the deposition plenum, and are exhausted through the top of the deposition plenum. By providing a plenum having one or more large surface area walls formed of the material to be coated, an extremely efficient coating system is provided. Of course, while less efficient, one of the larger walls may be replaced with a stationary component such as an observation window. This may be useful in experimental analysis of the process, or in production if only one roll of coated material is desired. The stationary wall may later be cleaned to remove any coating that forms thereon, or may be a substrate upon which a coating is desired. Should it be desired to coat other flexible substrates using a roll-to-roll mechanism, these substrates (such as wires, tubes, strips, or fiber optic cable) may be attached to a support web or directly wound onto the supply and take-up rolls. These materials may then be fed through the deposition plenum as described with respect to continuous sheets above.

Other types of non-flexible substrates may also be coated in a continuous manner. For example, rigid sheets, tubes, strips, rods, can be connected to each other or conveyor-fed into the deposition plenum in a consecutive fashion, and collected upon exiting the plenum using appropriate feed mechanisms as is known in the automation industry. Furthermore, these substrates as well as flexible substrates may be produced just prior to entering the deposition plenum by extruding, rolling or other methods, to combine manufacturing processes in an efficient manner. When extrusion of the material into a particular shape (for example, rod or sheet) is accomplished just prior to entering the deposition chamber, the extruder may act as the supply means for the continuous feed coater, as opposed to a supply roll as described with respect to the roll-to-roll embodiment described below. Additional post-processing steps (such as cutting, stacking, or annealing) can be used as well to further increase the overall efficiency of the production process. The versatility of the continuous feed coater allows for the deposition of many types of material. By providing a number of consecutive deposition plenums, several different coatings can be deposited "back-to-back", either prior to or after other substrate processing steps. For example, a manufacturing process could include the following steps: rolling of a metal material to form a sheet; routing the sheet into a first deposition plenum to coat a surface of the sheet with a first material; routing the sheet into a second deposition plenum to deposit the same or a different material on the same or opposite surface; routing the continuous sheet to a cutting station to form a number of plate substrates; routing the plates into a third deposition chamber to deposit a third material on a surface of the plates; and sending the plates to a stacking station for collection. Of course this is only an example and many combinations, variations, and extentions of such manufacturing processes are possible. As these combined manufacturing techniques are known, further explanation is not deemed necessary within the scope of the present application.

The configuration of the continuous feed coater wherein the deposition plenum walls are provided in large part by the substrates to be coated, provides an advantage over prior art deposition methods and chambers. In prior art deposition methods, a substrate is placed within a deposition chamber and the deposition material is fed into the chamber, resulting in the deposition of the material on the substrate as well as the internal walls of the deposition chamber and other undesired surfaces. Although some portions of the deposition plenum of the present invention (such as side dams) may not be in the form of to-be-coated substrates, a substantial percentage of the deposition plenum is a substrate surface. The efficiency of the process increases as this percentage increases. In some embodiments (such as those having a plenum wall in the form of an observation window) this percentage may be as low as 40%, 50% or 75%. In more efficient embodiments, 90%, 95% and even as high as 99% of the internal surface area of the plenum chamber is in the form of a substrate surface. A simple example to illustrate this would be to consider two 122 cm wide sheets separated by 1 cm (the width of the side dams that seal the plenum chamber). Assuming a uniform width profile along the length of the plenum chamber, this yields a usable substrate percentage of 244 cm/244 cm+2 cm=99.19%. Of course, the side dams themselves could be strips of substrate material thereby increasing the percentage of usable substrate surface. If the individual sections of substrate contact or touch one another, including purposefully contacting or touching one another, side dams may be unnecessary, although some portions of the substrate along their edges may not be sufficiently coated. Such uncoated or partially coated portions outside of what is herein referred to as the substrate target area, may need to be trimmed in subsequent manufacturing processes.

The environment within the plenum chamber is not limited to any specific gas or liquid flow or pressure. Nor does the configuration and orientation of the plenum walls need to be limited to the vertical orientation as described with respect to the preferred embodiment of the roll-to-roll coater as described in the detailed description. An example would be when the walls of the deposition plenum are continuously moving or in the form of removable panels and strips. The interior of the plenum can be provided with a vapor for vapor deposition on the substrates. Alternatively, should the coating method involve spraying of liquids or coating powders onto the substrate surface(s), standard atmosphere may be used to allow flexibility of the coating operation. In some instances it may be required to fill the plenum with an inert gas, such as nitrogen, to reduce reaction of the deposition species prior to depositing on the substrate. In other cases, a gas (such as oxygen) that is provided in the plenum may react with any vapor or liquid provided, to form the desired coating material before or as it is deposited on the substrate surface(s). Given the teachings of the present application, one of ordinary skill in the deposition field would recognize that there is an unlimited number of combinations of deposition techniques that fall within the scope of the present invention.

The deposition techniques of the present invention have an advantage over prior art methods because the deposition material is directed substantially obliquely to and then flows substantially parallel to the substrate (as opposed to other methods wherein the vapor is directed to impinge directly, such as at a perpendicular angle, on the surface and residual material flows away). In this manner, the dwell time is increased, thereby allowing more of the coating constituents to be deposited. Turbulent flow between the substrates and within the deposition plenum, can further increase deposition efficiency and uniformity. While the preferred embodiment is described having a vertical material flow through the deposition plenum, it should be understood that flow through the plenum can be upwards, downwards or sideways depending on the application. As a heated deposition vapor is used in the preferred embodiment, a vertical flow is useful to take advantage of the inherent thermal updraft.

For embodiments and methods of the present invention wherein fluid flows through the deposition plenum, it is often advantageous to provide turbulence within the plenum to form a more homogeneous and uniform coating over the surface(s) of the substrate(s). With the CCVD embodiments using a flame as a heat source to form at least part of the deposition species, one method of providing turbulence is to fan the flame. This "fanning" may be accomplished by pulsing air toward the flame using a jet, or a fan blade placed in proximity of the flame. Other means of creating turbulence within the plenum include but are not limited to: resonating pulses of air (or other gas) jets; acoustic waves (provided by oscillating the substrates themselves or other walls of the plenum, or by pulsing air jets in the audio range); or through the use of mechanical diffusers. Rods, strings or other objects placed within the fluid flow path create turbulence. The material of these objects may inhibit nucleation of the deposition species to avoid build-up on these objects. Alternatively, the objects may be substrates themselves, such that accumulation of the coating thereon is desired. Oscillation of the substrates may be caused magnetically depending on the magnet properties of the substrates, or may be produced by fluid jets or acoustic waves impinging on the one or more surfaces of the substrates.

The coating material supply source can be any one or combination of sources such as: bubblers; sublimers; CCVD nozzle(s); ultrasonic vaporizers; nebulizers; physical evaporators; etc. Other materials may also be deposited using the continuous feed coater by providing one or more spray nozzles for delivering spayed material such as thermal sprays (molten materials that are normally solid at room temperature) and liquid sprays. Powder coatings may also be applied using the continuous feed coater. By electrostatically charging the substrates, the sprayed powder is directed to the substrate surface. Simultaneous or subsequently heating the substrates allows the coating to fuse and cure on the substrates. In the described preferred embodiment, a dual nozzle CCVD apparatus is used, and a nozzle shield is provided to direct the vapors from the CCVD flames at the converging substrates while pressure differentials direct the flow between the two sheets of material. The flames are scanned back and forth across the bottom of the plenum to spread out the coating constituents and provide a uniform coating across the width of the webs. Different flame arrangements may be used to promote turbulence and/or uniform distribution of coating material within the plenum. For plenums with elongated cross sections, a row of flames may be used, while plenums with multiple equal sides may require the use of flames in a circular configuration. It should be understood that the below-described CCVD-based material supply is exemplary in nature and many different sources can be used, depending on the type of material deposited. For example, should it be desired to deposit nickel or copper, a spray of nickel ethylhexanoate or copper ethylhexanoate may be used. Alternatively, a bubbler containing the appropriate vaporizable precursors could be used and tubing would route the deposition vapors into the bottom of the deposition chamber.

The top of the plenum has an outlet that is at a lower pressure than the pressure within the plenum. In the immediate example of a roll-to-roll coater, an exhaust fan is used and the speed of the exhaust fan is controlled based on static pressure measured in the exhaust system. A plurality of runners are spaced across the width of the plenum such that all of the gas flow is through the runners. Each of the runners includes a venturi with a slide valve for adjusting the flow through each runner separately. Below each slide valve within the venturi is a temperature sensor and a static pressure sensor for measuring the temperature and the pressure, respectively, of the gas flow through each venturi. A collector above the runners includes a static pressure sensor for measuring the pressure down-stream of the runners. The static pressure, as measured by static pressure sensor, is used as a basis for controlling the exhaust fan and as a base-line measurement for controlling each of the slide valves. In this manner, the plenum condition data are used for controlling the sizes of the orifices relative to each other, and consequently the differential pressure across the width of the chamber, to further provide an even coating across the width of the two webs of substrate material. This control may be provided in the form of manually adjusted orifices, or an automatic feedback control system may be used if dynamic control is required. The exhaust system is an integral part of the roll-to-roll coater; however, it should be clear that this type of fluid flow control can be used in other deposition apparatus or other fluid control devices. It should also be understood that fluid in this context extends to any material that flows, including but not limited to gasses, liquids and suspensions.

For uniform thickness the rolled material is fed at a constant rate of speed, using an idler wheel with an encoder and suitable feedback controls for this purpose. The vapor produced is placed in close proximity to large portions of the substrate, and undeposited vapor is drawn away. This results in a very efficient coating method. An alternative drive system, using a pull roller and an edge nip roller (similar to those used in tape drive mechanisms), can be used to ensure constant speed of the web without the need for speed measurement and feedback control. The take-up rollers, as described in the detailed description below, are then driven only to wind the webs thereon. To maintain tension in each web as it is wound about the take-up roller, a load cell mounted idle roller is used to provide tension feedback to control the motor that drives the take-up roller.

Two different web-handling embodiments are disclosed, the specific embodiment used being dependent on the material being coated. In a first embodiment, within the deposition chamber are a number of horizontally oriented arch bars. These arch bars are made of low-friction material and guide the sheet material so as to form a small bend in the web along a horizontal line. At these locations where the two webs are redirected by arch bars, a venturi effect is created by the change in flow area. This venturi effect creates turbulence in the vapor, breaking down the boundary layer and resulting in a more homogeneous and even coating. The arch bars may alternatively be a type of air bearing wherein air is directed through small holes in the arch bars to support the web in a low friction manner. A second embodiment of the web-handling portion includes a vacuum chuck that holds the two webs flat to avoid buckling or wrinkling of the webs and thereby provide more uniform surfaces and more uniform resulting coatings.

Many coating methods require that the substrates be heated to allow the coating to form on the surface of the substrates. The configuration of the continuous feed coater of the present invention allows for this heating to be done in a number of different ways. Heating bars are provided behind the web substrates in the plenum chamber to provide heating of the substrates while in the plenum chamber. As the substrates enter and exit the plenum chamber, it may be necessary to heat and/or cool the substrates in a staggered or step by step manner. In the roll-to-roll embodiment of the coater, this can be done by heating each of the rollers that route the web to consecutively higher and lower temperatures. When air bearings are used in place of solid rollers, the air can be heated or cooled to control the temperature of the substrate. This heating or cooling is dependent on the materials being used and the final product required. For example, when producing embedded resistors by depositing platinum on copper foil, an initial temperature of the foil is approximately 22° C. (room temperature). For example, in a first stage, the foil temperature is raised, first to 66° C., then to 77° C. and finally to 93° C. in the plenum chamber. Upon leaving the plenum chamber, the foil temperature is reduced to 77° C., then to 66° C. and is finally returned to room temperature. This step-wise increase and decrease in temperature helps to control expansion and contraction of the foil, thereby reducing wrinkling that can degrade the final product. It should be understood that for other applications heating, cooling and possibly both heating and cooling of the substrates may be required at various stages of the deposition process, depending on the materials and products being produced. It is even envisioned that wrinkling or other temperature-induced deformation of the substrates may be desired in some applications.

In order to ensure that the desired coating is applied to the webs, a web inspection system is preferably used. As the webs leave the deposition chamber, the web inspection system scans the webs using x-ray florescence (XRF), optical or other type devices. These inspection methods are well known in the deposition field, and a detailed description is therefore deemed unnecessary. The inspection system may include a number of sensors spaced across the width of the webs, or may be in the form of a mechanical scanning system as described below.

The electrical motors, brakes, plenum and other systems of the roll-to-roll coater may be controlled in a manual manner by determining optimal settings and adjusting the various controls using operator input devices. Should a more controlled system be desired or required, a computer-based control system may be employed. As described below with reference to the drawings, the computer-based system includes a number of sensors for measuring speeds, flow rates, temperature, and pressure from various components of the roll-to-roll coater. Based on the signals received from these sensors, the computer can then control the motors, brakes, pumps, valves, and other control devices used in the roll-to-roll coater. The programs used to produce the desired results are well within the skill level of the average computer programmer, and therefore are not discussed in detail in the present application.

The deposited layers formed using the present invention may be as thin as a molecular monolayer as the method of the present invention is capable of producing a continuous monolayer coating. Such thin layers have utility, e.g., as a seed layer for subsequent electrodeposition or electroless plating. Thus, the thinnest layer that can be deposited is dependent upon the size of the individual molecule or mixture of molecules being deposited. Generally, however, a layer at least several molecules thick will be deposited to ensure that the layer is continuous over the substrate surface.

Likewise, depending upon the coating time, there is no real upper limit to the thickness of a material that can be deposited. However, deposition of very thick layers may not be efficient when compared with other methods for preparing thick coating.

An important material being deposited by the roll-to-roll coater of the present invention is a platinum/silica composition used for forming embedded resistors. The thicknesses of such layer may be down to a monolayer but is typically at least about 10 nanometers. Using a currently preferred etching procedure for such thin layer materials, the upper limit of such a layer is about 150 nanometers, although more rigorous etchants may be used to etch thicker layers. The currently preferred thicknesses for platinum/silica thin layers for forming embedded resistors is in the range of between about 50 and about 120 nanometers.

Maximum and minimum film thicknesses for other materials will be material dependent and end use dependent.

BRIEF DESCRIPTION OF THE DRAWINGS

FIG. 5 is an enlarged portion of the deposition chamber showing details of a first embodiment of the web-supporting means of the roll-to-roll coater.

FIG. 6 is an enlarged portion of the deposition chamber showing details of a second embodiment of the web-supporting means of the roll-to-roll coater.

FIG. 7 is an enlarged view of one of the adjustable mechanisms and bearings used to rotatably hold the web-support rolls.

FIG. 10 is a top view of an array of a plurality of moving webs configured to form a plenum.

FIG. 11 is a cross-sectional view of the array of webs of FIG. 10.

FIG. 12 is an enlarged view of a portion of a gas-directing air-flow tube shown in FIG. 11.

FIG. 13 is a partial cross-sectional view of an array of webs using a mechanical gas-direct apparatus.

FIG. 14 is a partial cross-sectional view of an array of webs being coated with a rotating spray device.

FIG. 15 is a top view of a further embodiment of the rotating spray device of FIG. 14.

FIG. 16 is a side view of a flat plate deflector embodiment of a spray device for coating the webs.

FIG. 17 is a side view of a conical deflector embodiment of a spray device for coating the webs.

FIG. 18 is a top view of a fan type deflector embodiment of a spray device for coating the webs.

FIG. 19 is a cross sectional view showing alternate routing methods of the webs as well as a number of alternate turbulence inducing means.

DETAILED DESCRIPTION OF THE PREFERRED EMBODIMENT

Figure 1:
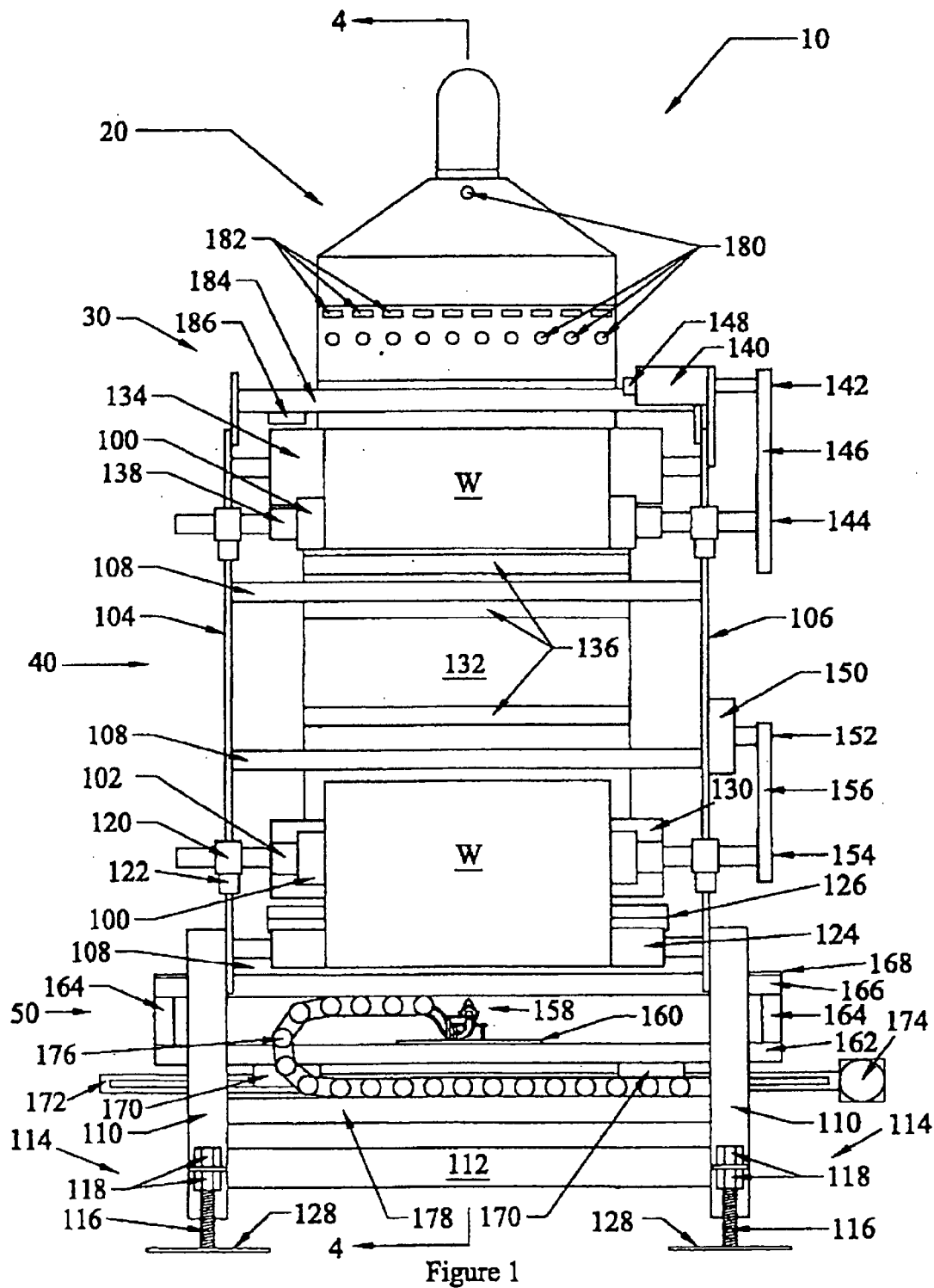
FIG. 1 is an elevational view of the front of the roll-to-roll coater of the present invention.

The present invention may be understood more readily by reference to the following detailed description of preferred embodiment of the invention and the figures. It should be understood that the following embodiment is shown as a particular embodiment of the continuous feed coater, and as described in the summary many variations are possible without departing from the scope of the present invention.

FIGS. 1–4 show various views of a roll-to-roll coater 10 embodiment of the continuous feed coater. The roll-to-roll coater includes a pressure-controlled exhaust system 20, an in-situ coating inspection system 30, a web-handling portion 40, and a coating material supply 50. All of these subsystems are mounted on a frame. The frame includes two side plates 104 and 106 that are held together by a number of cross bars 108. The side plates 104 and 106 are both in two pieces that are connected by arms 202 and supported on legs 110. The legs are connected by longitudinal cross beams 112 and lateral cross beams 204. Legs 110 each include a support flange with a height and leveling adjustment mechanism 114 that comprises a threaded shaft 116, adjustment nuts, 118 and feet 120. As this type of height and leveling adjustment mechanism is well known, a further explanation is not deemed necessary. The frame members may be made of any suitable material depending on the overall size and strength requirements of the roll-to-roll coater 10. Aluminum has proved sufficient for side plates 104 and 106, legs 110, and cross beams 112 and 204, while stainless steel is used for strength of the cross bars 108.

The overall operation of the roll-to-roll coater 10 is best described by first explaining the route of the material web as it traverses the web-handling portion 40 with respect to FIGS. 1–4. It should be noted that the following description is directed to either the left or right web-handling portion 40 as viewed in FIG. 2 or 4, the opposite web-handling portion being a mirror image of the other. A web of material W is supplied mounted on a web-support roll 100. It should be understood that the term web is not intended to be limiting and includes metal foils, plastic sheeting material, or any other sheet material that can be wrapped around a roll and on which it is desired to place a coating or film. Other rollable substrates include strips, wires, tubes, and fiber that may be mounted on a support web to seal the large sides of the plenum chamber between the substrates to be coated. The web-support roll 100 is mounted on a supply roller 102 that is attached to the side plates 104 and 106 using suitable bearings 120 that rest on top of support ledges 122. The bearings include adjustment mechanisms that are described in detail below, such that their position with respect to the support ledges 122 and the edge of the plates 104 and 106 can be changed (into and out of the page as viewed in FIG. 1), to account for skewing of the web. An alternative supply mechanism may be used wherein the web is extruded just prior to being routed into the roll-to-roll coater. This would eliminate the need for a supply roller. As the web leaves the support roll 100 (or other supply mechanism), it is routed around feed roller 124. Feed roller 124 may be rotatably mounted to side plates 104 and 106 or preferably are in the form of air bearings. More preferably, these air bearings are in the form of a corrosion resistant, porous, solid metal roller, that includes an air supply port at one end thereof. Air bearings are well known in the art of foil handling, and include a number of air or gas ports that are spaced along that portion of the roller surface that would contact the foil or web. As the air or gas leaves these ports, a cushion of air is formed between the roller surface and the foil that maintains the foil spaced from the roller surface, thereby minimizing friction. Obviously, air bearings would be less effective should the web be a porous material. As the web is guided around feed roller 124, it slants upwardly and inwardly to form a tent-shaped inlet area 400 (see FIG. 4) of the deposition chamber. Two lower side dams 200, shown in FIGS. 2 and 3, form the other two sides of the inlet area 400.

After leaving the feed roller 124, the web passes by a web temperature controller 126 that in one embodiment is a pre-heater to aid in heating the web prior to entering the deposition plenum. Alternatively, web temperature controller 126 may be a pre-cooler to reduce the temperature of the web prior to entering the deposition chamber. Depending on the material of the web, pre-heating can be important to allow the web to expand prior to entering the deposition chamber where such expansion may result in wrinkling of the web. When other types of material are coated, it may be necessary to actually cool the web prior to the coating process. Other temperature controllers (not shown) may be used to provide staggered increases or decreases in temperature both before entering the deposition plenum (as with temperature controller 126), as well as after exiting the deposition plenum. The various rollers used to route the web through the roll-to-roll coater may be heated or cooled to provide this temperature control. Further, when air bearings are used in place of these rollers, the air itself may be heated or cooled to provide the temperature control.

The web enters the deposition plenum and is redirected upwardly by lower tangent roller 130. A web-support plate 132 extends between the lower tangent roller 130 and an upper tangent roller 134. The web-support plate includes web-supporting means as is described in detail below with respect to FIGS. 5 and 6. The back of the web-support plate includes a number of heater bars 136 for raising the temperature inside the deposition plenum, if required. The top and bottom of the web-support plate 132 includes edge seals 138 for sealing the deposition plenum from the surrounding atmosphere. Edge seals 138 are formed of polytetrafluoroethylene or other heat-resistant, low-friction material. While upper and lower tangent rollers 130 and 134 may be rotatably mounted to side plates 104 and 106, it is preferred that they be in the form of air bearings as described with respect to feed roller 124. When air bearings are used, edge seals 138 do not necessarily need to be formed of low-friction material. An advantage of using the air bearings for the above mentioned rollers 124, 130 and 134, that is unique to the present invention, is the ability of the air bearings to allow lateral expansion and contraction of the web as it heats and cools. This reduces or eliminates any wrinkling of the web, resulting in a superior finished product. The two web-support plates 132 are connected to one another and supported by a left-side air dam 214 and a right-side air dam 300. In addition to inhibiting the deposition gasses from leaving the deposition plenum, the side air dams 214 and 300 also support the web-support plate, as they are attached to arms 202 via suitable support bars (not shown). After leaving the deposition plenum and being guided around upper tangent roller 134, the web is wound about the web-support roll 100 mounted on the driven take-up roller 138. Alternatively, other web take-up mechanisms may be used such as cutting and stacking stations. These would eliminate the need for a take-up roller, should the desired product be in the form of discrete sheets or panels of coated material. In order to drive the web through the web-handling portion 40, a drive motor 140 is operatively connected to the driven take-up roller 138 using a drive gear 142, a driven gear 144, and a drive belt 146. An encoder 148 is attached to the motor shaft to monitor the position and speed of the motor shaft during the coating operation. Computer-based speed control of the web is included in the overall computer control of the roll-to-roll coater, as described further below. In order to keep the web taut as it is fed through the deposition plenum, an electromagnetic brake 150 is operatively connected to the supply roller 102 using a braking gear 152, a braked gear 154, and a brake belt 156. As with the speed control, the electric input to the brake 150 (and therefore the braking force) is varied by the computer control system described below. While the preferred embodiment of the belt and gear mechanisms include toothed, elastomeric, timing belts and notched gears, other types of gearing mechanisms may be employed depending on the size of the roll-to-roll coater, the material being handled, and other factors. The relative sizes of the gears are shown as exemplary, and the actual size that is required is chosen based on desired web speed, motor and brake types, as well as other factors. As previously stated, a further embodiment of the drive system (not shown) could include a pull roller and an edge-nip roller similar to a capstan drive used in tape-drive systems. Many other drive mechanisms may also be employed to push, pull or otherwise drive the web through the roll-to-roll coater. These details are well within the skill level of an electromechanical engineer, and as such have not been described herein.

Figure 2:
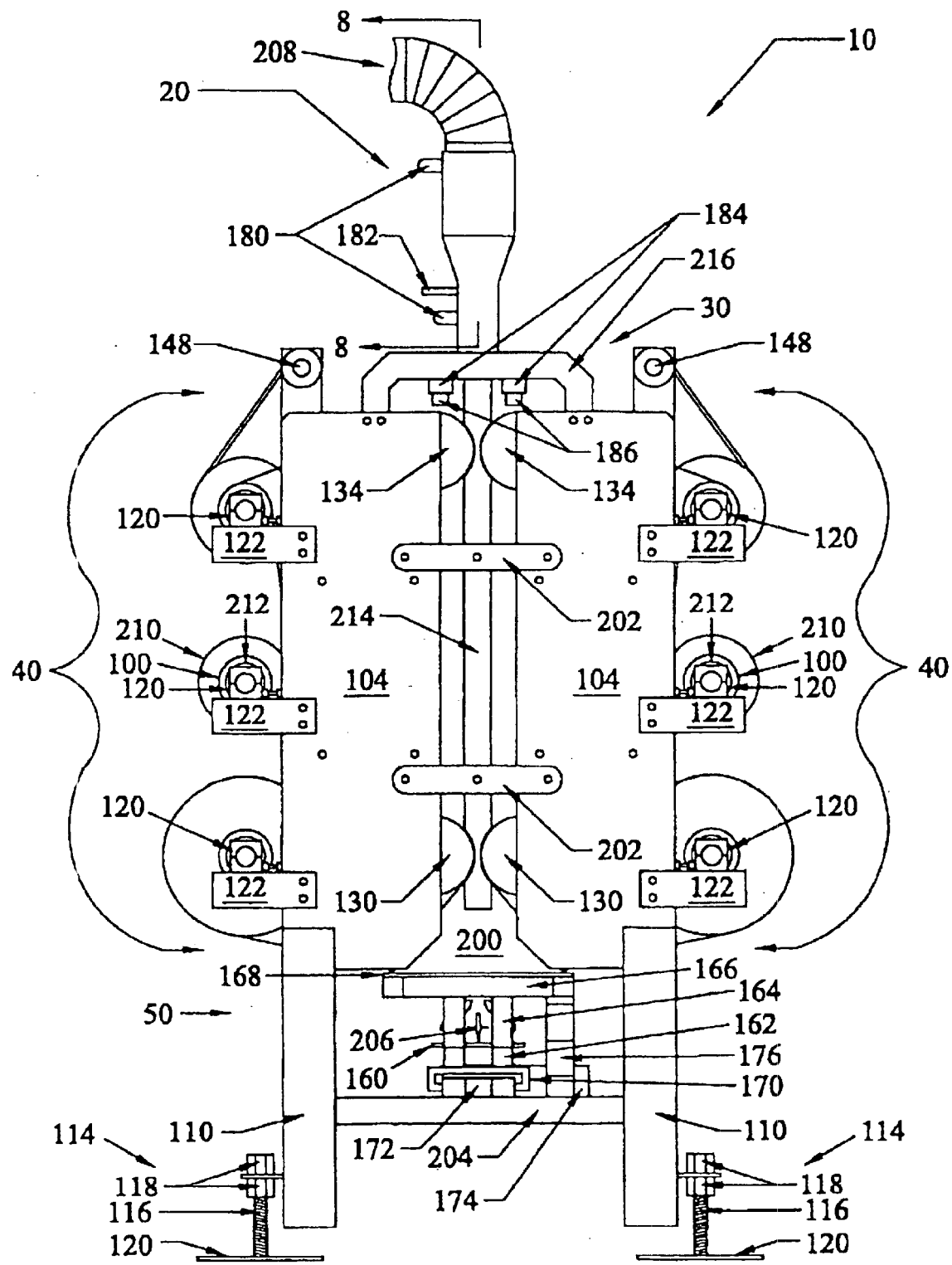
FIG. 2 is an elevational view of the left side of the roll-to-roll coater of FIG. 1
Figure 3:
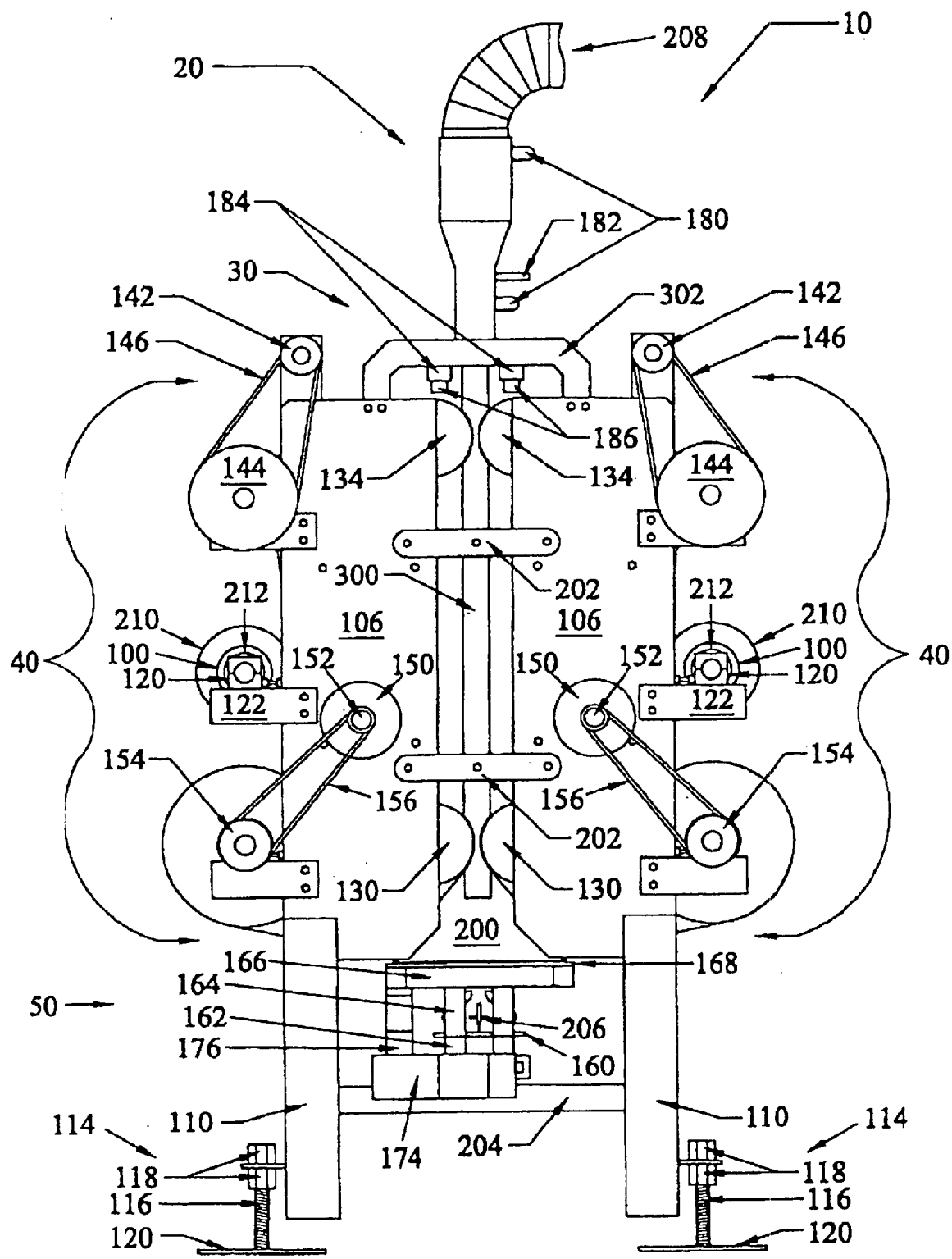
FIG. 3 is an elevational view of the right side of the roll-to-roll coater of FIG. 1.
Figure 4:
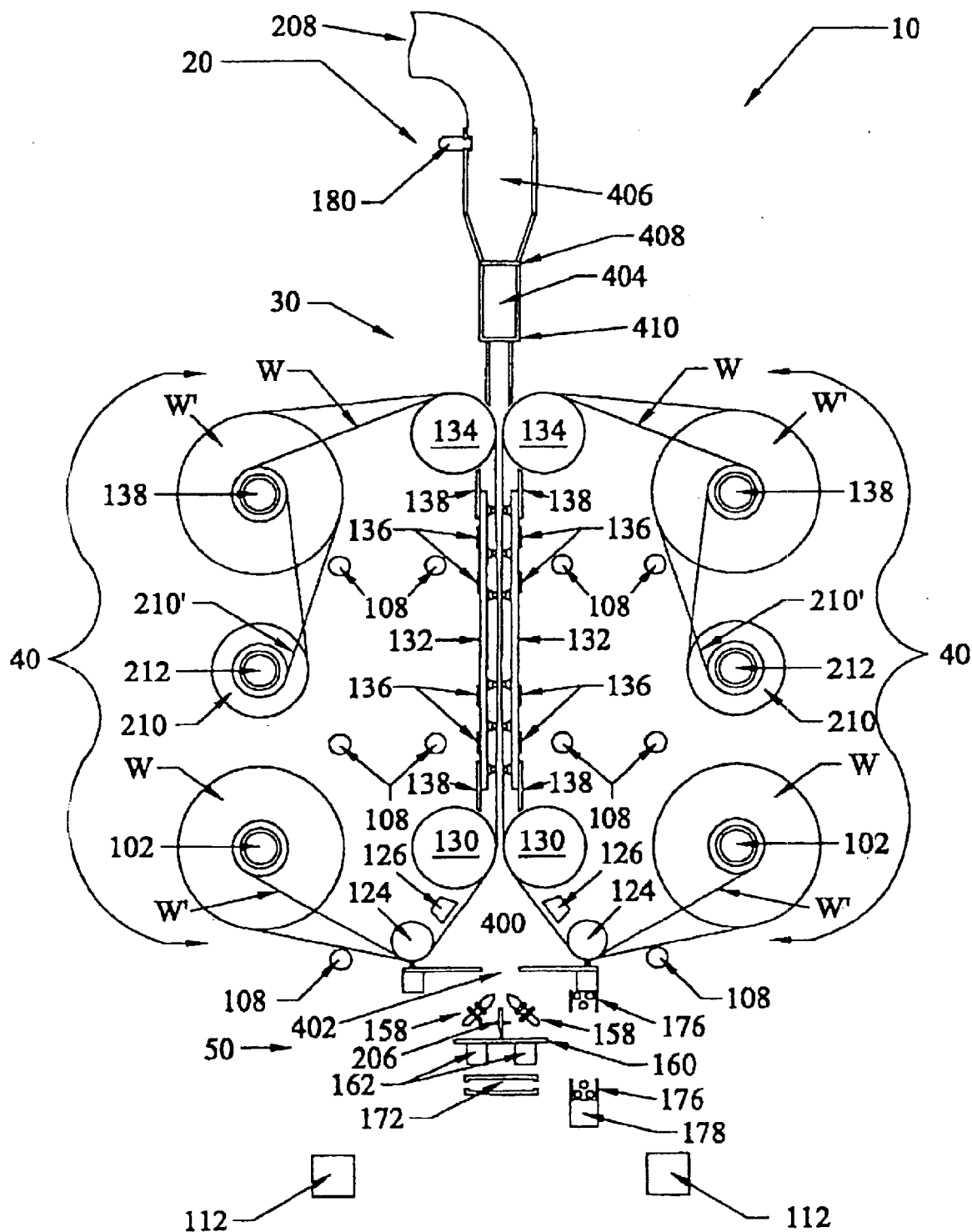
FIG. 4 is a cross section taken through line 4—4 of FIG. 1 showing the opposed web structure of the roll-to-roll coater.

FIGS. 2–4 illustrate an optional slip-sheet 210 that can be used to protect the coated web, once it has exited the deposition plenum. The slip-sheet 210 and support members have been omitted from FIG. 1 for clarity. Slip-sheet 210 is wound about a web-support roll 100 similar to the web-support rolls that the web is wrapped around. The web-support roll 100 is mounted on a slip-sheet roller 212 that is rotatably mounted to side plates 104 and 106. As the web is wound about the web-support roll 100 that is mounted on take-up roller 138, the slip-sheet 210 is also wound about the web to form a protective layer between adjacent layers of the web. The slip-sheet 210 can be made of any protective material, plastic being preferred when the web is a metal foil, although cloth-based or paper-based slip-sheets may be used for other applications. Beyond protecting the coated webs, the slip-sheet may actually form a part of the finished product. This could be in the form of a self-adhesive or heat-activated adhesive material, or may be adhered to the web in subsequent manufacturing processes. FIG. 4 shows the routing of the web and of the slip-sheet as the deposition process proceeds from a full supply roller 102 to a full take-up roller 138. Web W, shown in solid lines, indicates the initial web route while W', in dotted lines, indicates the final web route when it is required to replace the web-support rolls on both the take-up roller 138 and the supply roller 102. By using identical web-support rolls 100, the now empty web-support roll 100 on the supply roller 102 can be moved to the take-up roller 138, and a new web-support roll 100 loaded with uncoated web can be placed on the web-supply roller 102. The initial and final route of the slip-sheet 210 has also been indicated, 210 being shown in solid lines as the initial route, and 210' being shown in dotted lines as the final route. Obviously, electronic sensors (optical sensors or mechanical trip levers) may be employed to alert operators that one or more of the rolls 100 needs to be replaced.

The vapor for coating the web is produced and/or supplied by the coating material supply source, indicated generally as 50. The particular embodiment shown uses two CCVD nozzles 158 as described in U.S. Pat. No. 5,997,956, although many other material sources may be used, as previously described. Between the two flames produced by these nozzles is a centrally located air or gas jet 206 that directs the deposition gasses upwards and helps to spread them out as they travel toward the deposition plenum. The nozzles 158 and jet 206 are mounted on a nozzle-support plate 160 using suitable brackets and standoffs. These brackets may be adjustable to allow changing of relative angles and positions of the nozzles 158 and jet 206, should this be required. The plate 160 is, in turn, supported on two beams 162 that extend beyond the sides of the roll-to-roll coater 10 when in the central location as shown. Four vertical supports 164 are positioned on the ends of the beams 162 to support an isolation plate frame 166 and a bottom isolation plate 168. Isolation plate 168 includes a centrally located opening 402 (shown in the cross section, FIG. 4) that allows the deposition gasses formed by the CCVD nozzles 158 to enter the deposition plenum. The remainder of isolation plate 168 is closed, to preclude the deposition gasses from leaving the bottom of the plenum, as well as to keep contaminants out of the plenum and to provide for the correct flow of deposition gasses through the deposition plenum. To provide a uniform deposition, the CCVD nozzles 158, jet 206, as well as the entire carriage supported on beams 162 are scanned back and forth as viewed in FIG. 1, between the two lower side dams 200. The additional length of the isolation plate 168 insures that the bottom of the deposition chamber is always closed as this scanning takes place. Two brackets 170 support the beams 162 and are moved back and forth by a traversing mechanism 172, as is well known in the automation industry. An electrical motor 174 provides for this motion and is controlled by the computer system of the roll-to-roll coater. To protect the various flexible gas and liquid supply tubes used by the nozzles 158 and jet 206, a flexible conduit 176 surrounds the tubes and flexes to accommodate the travel of the assembly. The ends of the flexible conduit 176 are connected to frame 166 above and beam 178 below, while the traversing mechanism 172 is supported on lateral cross-beams 204. The gas and liquid supply cylinders, pumps, valves, and other controls have been omitted, as these are well known in the art of chemical vapor deposition CVD and further explanation is not deemed necessary.

Figure 8:
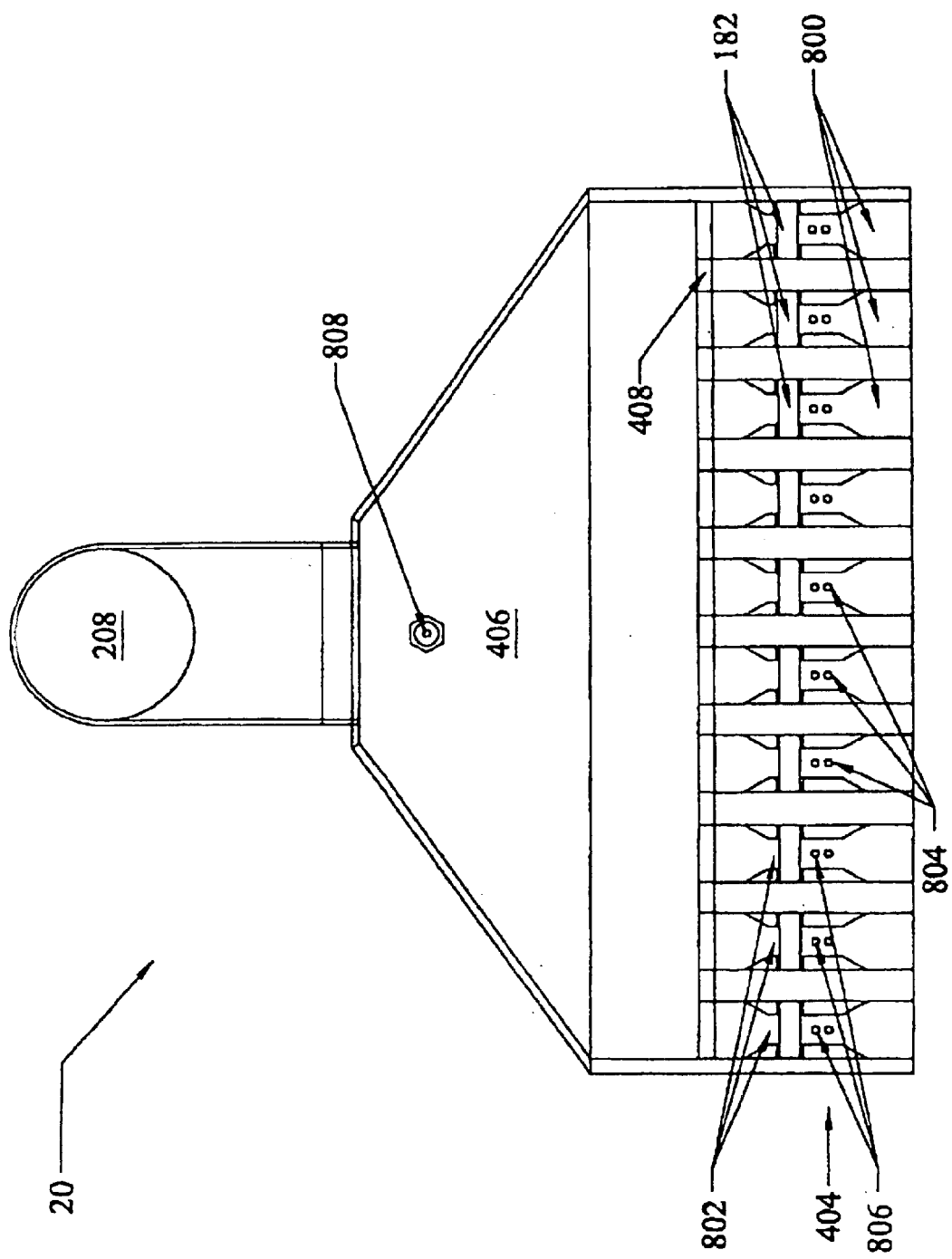
FIG. 8 is a cross sectional, enlarged view of the plenum of the roll-to-roll coater, taken through and in the direction of line 8—8 in FIG. 2, and showing the details of the interior of the plenum.

To control the flow of deposition gasses through the deposition plenum, a pressure-controlled exhaust system 20 is provided. FIG. 8 shows an enlarged cross sectional view of the exhaust system 20, thereby illustrating the details thereof. The outlet 208 of the exhaust system leads to an exhaust fan or other negative pressure source, and any post-deposition, vapor collection mechanism that may be needed. As the deposition process of the roll-to-roll coater is extremely efficient, post-deposition cleaning of the exhausted gasses is usually unnecessary. The advantage of the efficient deposition process of the present invention is many-faceted. By increasing the amount of material deposited that is supplied to the plenum chamber, the cost of collecting the undeposited material is reduced. Furthermore, the overall cost of capital equipment is reduced by not requiring expensive reclamation apparatus that is required downstream of the exhaust system in other deposition equipment. Another and perhaps most important advantage of the efficiency of the present deposition method is the reduction in the amount of environmentally unfriendly materials that are released into the atmosphere. By reducing the amount of these materials that are routed to the exhaust system, the overall amount released into the atmosphere is also reduced. Of course, as with any deposition method, a scrubber or a type of separation device may be used at the exit of the exhaust system to collect any undeposited material. This may be particularly important in cases where the undeposited material is relatively valuable, such as platinum or gold. In some cases the collected material may be a useful by-product such as nano-powders or other material that has uses beyond being deposited as a film or coating.

The speed of the exhaust fan is controlled based on the static pressure measured in the exhaust system 20. The outlet 208 is connected to a collector 406 that is, in turn, connected to a runner portion 404. A plurality of runners 800 extend from the top to the bottom of the runner portion 404, and a top runner support plate 408 and a bottom runner support plate 410 seal the space around the runners 800 to route all of the gas flow through the runners 800. Each of the runners 800 includes a venturi 802 with a slide valve 182 for adjusting the flow through each runner 800 separately. Below each slide valve 182, and within the venturi 802, is a temperature sensor 804 and a static pressure sensor 806 for measuring the temperature and the pressure, respectively, of the gas flow through each venturi 802. The collector 406 also includes a static pressure sensor 808 for measuring the pressure down-stream of the runners. The static pressure, as measured by static pressure sensor 808, is used to control the exhaust fan (not shown) and as a base-line measurement for controlling each of the slide valves 182 based on the temperature and pressure of the gas flow through each venturi 802. The sensors 804, 806 and 808 all include connectors 180 and wiring (not shown) to connect the sensors to the computer control system as described below. While the exhaust system has been described with respect to the roll-to-roll coater of the present invention, it should be understood that the exhaust system may be used to control fluid flow in any of a number of applications. In effect, the pressure controlling exhaust system produces a specific differential flow pattern across the width of the plenum, that can be adjusted manually or automatically to created uniform or other flow patterns as desired or required.

The actual coating of the web takes place in the deposition plenum, the details of which are more clearly shown in FIGS. 5 and 6, which are cross sections through the center of the deposition plenum. FIG. 5 shows a first embodiment of the deposition plenum that includes a number of arch bars 500. The arch bars 500 are mounted on the web-support plate 132 and are mounted progressively closer to their opposite arch bar from the bottom inlet upward to the center of the deposition plenum. The upper arch bars are mounted progressively further apart from their opposite arch bar from the center of the deposition plenum upward and to the top of the deposition plenum. Preferably, the uppermost and lowermost pairs of arch bars are 19.05 mm apart while the central two pairs are 6.35 mm apart with the intermediate pairs of arch bars being 12.70 mm apart. The optimal web spacing is application-dependent and is not intended to be limiting. This spacing can be 3 to 150 mm, more preferably 12 mm or less at the closest pass, and most preferably about 6 mm for platinum/silica deposition on copper foil. Generally, it is preferred that the foil layers come together at their narrowest approach as close as possible without making contact. A practical limitation with flexible material, such as foil, is the handling difficulties encountered with such materials. The approach cannot be so narrow that it cuts off meaningful gas flow. The web-handling difficulties are a major limiting factor with respect to minimal closest approach. At a maximum, the closest approach cannot allow gas flow at too high a rate. Otherwise vaporized material will pass through without coating the webs. As previously stated, for current coating purposes, the maximum closest approach is about 150 mm. It is to be understood that the above parameters for closest approach are in relation to coating processes for which the apparatus has currently been used. These parameters may vary depending upon factors such as the materials being deposited, the coating temperature, and the flow rate. It should also be understood that these spaces refer to the distance between "target" deposition zones on the web substrates, and other portions (such as the side edges) may actually touch to provide alternate means to seal the deposition plenum.

The above described arch bars provide a change in the web's direction at each of the arch bars forming a horizontal line in the web and a central venturi region in the center of the deposition plenum. As the high-velocity deposition gasses pass by these lines, a turbulence region is formed resulting in a breakdown of the boundary layer and a more consistent coating on the web. The arch bars may be solid metal or other material, or more preferably they are in the form of air bearings as described above with respect to rollers 130 and 134. The air bearing-type arch bars allow for sideways expansion and contraction (into and out of the page as viewed in FIG. 5) of the web as it changes in temperature during the coating process.

In some instances, due to the material of the web, required deposition temperature and other factors, it may be necessary to hold the web in a more positive manner. The embodiment of the deposition plenum shown in FIG. 6 includes a vacuum chuck for keeping the web flat against the chuck as it travels upward through the deposition plenum, so that buckling or wrinkling of the web will not occur. A central duct 601 is connected to a vacuum source (not shown) and provides a low pressure area between the web-support plate 132 and a perforated thin plate 600. Perforated thin plate or sintered metal plate 600 includes a plurality of tiny bores to allow the vacuum to pull the web tightly against the plate 600. It should also be clear that the above two embodiments can be combined by providing a perforated plate such as 600, that includes a number of small bends similar to those bends in the web produced by arch bars 500. In this manner the web can be securely held in place against plate 600, while still producing the beneficial turbulence described above. It may also be desired to have alternating regions of arch bars separated by vacuum chuck portions, thereby forming a deposition plenum with wide and narrow regions. These alternating regions would provide a greater degree of turbulence to enhance the uniformity of the coating.

With respect to the creation of turbulence within the plenum chamber, FIG. 19 illustrates various turbulence inducing means and alternate web routing. The alternate web routings include parallel webs 1900 bowed out webs 1902, diverging webs 1904, bowed in webs 1906 (similar to the configuration described above), and converging webs 1908. These routings may be selected to form different regions within the plenum for changing deposition material flow and inducing turbulence. It should also be noted that while these routings have been illustrated with respect to a two web system, they may also be used with multiple web systems as described below. To further increase turbulence within the plenum, it may be useful to provide turbulence-inducing means between the webs. One such means is shown as a horizontal tube 1910 that includes a number of ports for air or other gasses that act to create turbulence in the surrounding area. Another type of turbulence-inducing means are paddle wheels 1912 that include paddles that produce turbulence as the wheels 1912 turn in the path of the deposition material. These paddle wheels are most efficient when they turn at a rate greater than the flow rate of the deposition material, such that material flow is increased on one side of the wheels 1912 and decreased on the other. Of course, the direction the wheels turn 1912 may be changed periodically to further increase turbulence. A plain rod or tube 1914 is shown inserted in the deposition material flow path to induce turbulence. Rod 1914 may simply further be a substrate upon which it is desired to place a coating. This substrate 1914 may be manually placed in the plenum, or may be a continuous substrate that is fed through the plenum much the same way the webs are themselves. This provides a two-fold advantage of inducing turbulence while also providing additional substrate surface within the plenum chamber. Although the cross sections of the turbulence inducing means 1910, 1912 and 1914 have been shown as substantially circular, it should be understood that they may be triangular, rectangular, or any desired shape.

FIG. 7 illustrates the adjustment mechanism for the slip-sheet roller 212, the supply roller 102 and the take-up roller 138. The rollers need to be adjustable to account for left-to-right skewing (with respect to FIG. 1) that can occur in any web-handling apparatus. Bearing blocks 120 support the reduced diameter ends of the rollers (shown in FIG. 7 as supply roller 102) and include a bottom bearing block 700 and a top bearing block 702, both of which are supported on ledge 122. The top bearing block 702 has two through-bores, and threaded fasteners, such as bolts 704, extend through these bores and into threaded blind-bores in the bottom bearing block 700 to hold the bearing blocks together while allowing for removal of the rollers for reloading of the web. Bottom bearing block 700 includes pins 714 that extend into a groove 712 to maintain the side-to-side alignment between the bearing block 120 and ledge 122, as seen in FIG. 1. To adjust the spacing between the bearing block 120 and the edge 712 of the side plates 104 (or 106), a threaded bore 708 in the side plate includes a threaded fastener 706 therein. By screwing the fastener 706 in and out of the bore 708, the distance between the bearing block 120 and the edge 712 of the side plate is adjusted, (keeping in mind that all of the rollers 102, 138 and 212 are drawn inwardly by the force exerted by driving of the web). The end of fastener 706 is preferable rounded to reduce friction between the fastener 706, and the bearing block, thereby easing the adjustment. A locking nut 710 is tightened against the edge 712 of the side plate to lock the position of fastener 706 when the adjustment is complete.

A web scanning inspection system 30 is preferably included on the roll-to-roll coater to allow in-situ inspection of the coating as it exits from the deposition plenum. A track 184 extends across the width of the roll-to-roll coater and is supported by bridge supports 302 and 216. An inspection shuttle 186 travels back and forth across the width of the web along the track 184 and includes optical or other instruments for inspecting the coating. These instruments measure depth of the coating, epitaxial nature, smoothness, and other properties of the coating. Alternatively, a plurality of sensors can be spaced across the width of the web, depending on the type of instrument(s) being used. The various optical and other coating inspection systems used are well known in the field of material coating, and further explanation is not deemed necessary. The unique positioning within the context of the roll-to-roll coater of the present invention allows in-situ inspection of the coating that allows operators to adjust deposition conditions to provide for optimal coating parameters. Of course, computer controls may assist or replace the operator-based controls.

Figure 9:
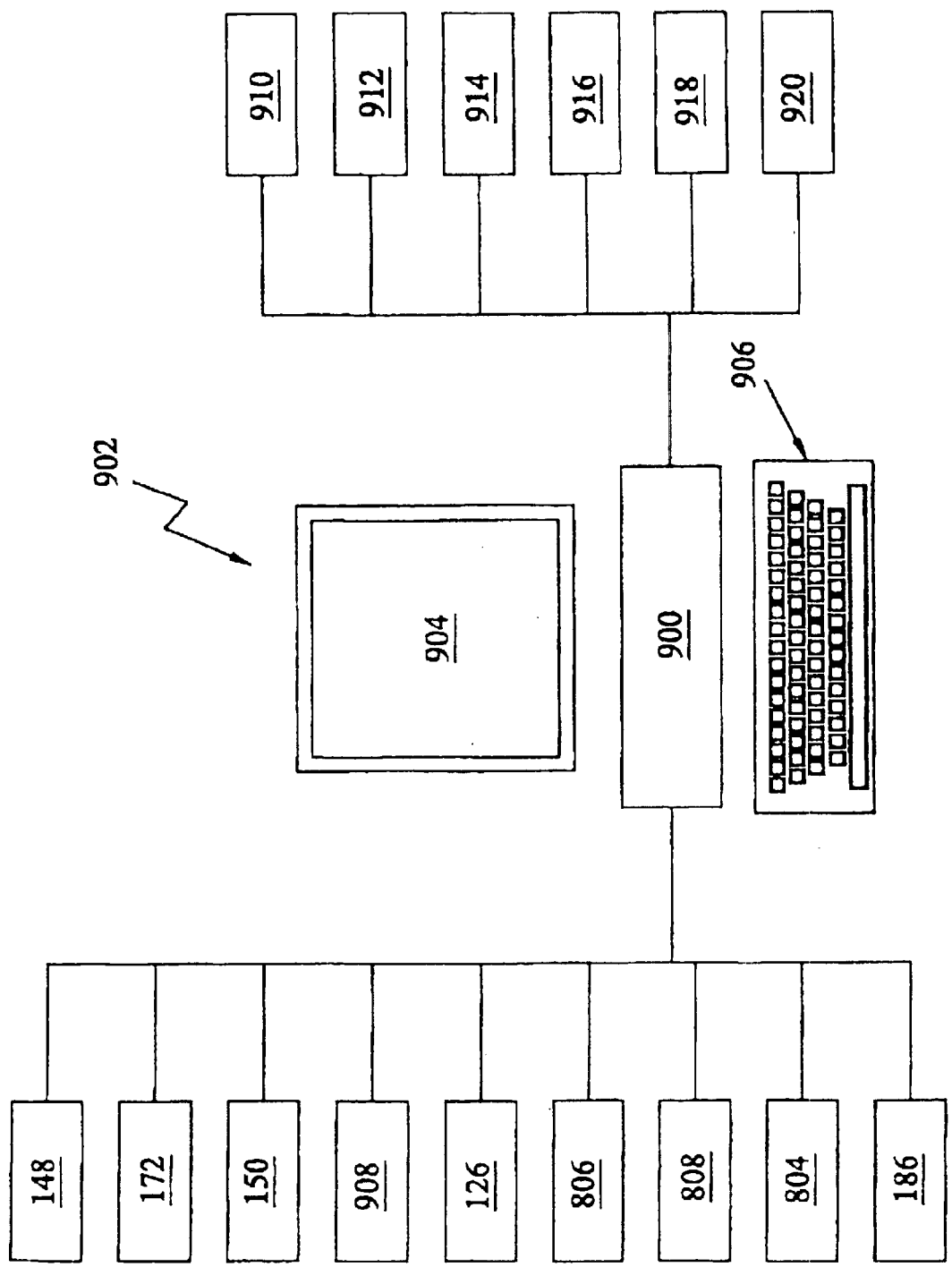
FIG. 9 is a block diagram of the computer-based control system of the roll-to-roll coater.

To provide monitoring and control of the various electrical components, a computer-based control system may be used. A block diagram of the computer-based control system is shown in FIG. 9. A central processor unit (CPU) 900 receives input from the various sensors and sends control signals to the various control devices. Preferably, the CPU is part of a conventional personal computer (PC) system 902 that includes a monitor 904 and a keyboard 906. The inputs include: web speed indicating signals from the encoder 148; rastering speed indicating signals from the traversing mechanism 172; web braking force indicating signals from the electromagnetic brake 150; deposition gas and liquid flow rates from the CCVD nozzles, and redirect control 908; pre-heater/cooler temperature from the pre-heater/cooler 126; static pressure from static pressure sensors 806 and 808; venturi temperature from temperature sensors 804; and optical or other input from the web scanning inspection system 186. The outputs include: drive motor 140 control circuitry 910; electromagnetic brake 150 control circuitry 912; traversing motor 174 control circuitry 914; deposition gas, liquid and redirect flow control circuitry 916 (pumps, valves, etc.); heater/cooler 126 (and others) control circuitry 918; slide valve 182 servo motor controllers 920 (if automatic control of the slide valves 182 is needed); and web-scanning inspection system control circuitry 922 (if needed).

The various control parameters that are used during a coating operation are predetermined based on the quality of the resulting coating. The web speed, as determined by the drive motor, affects the thickness of the coating and in most applications is relatively slow (between 5 and 200 mm/min.). Furthermore, the web speed need not be uniform, but may be pulsed stepwise, increased and decreased gradually or may stop altogether. One such example involves batch deposition wherein the web is driven until a specific portion is within the plenum, and is then stopped. Deposition would continue on this specific portion until the desired coating is applied, and the web(s) would then be driven to remove the specific portion from the plenum while loading another portion of the web(s) into the plenum. This can be carried a step further to consider the use of panels for the deposition walls instead of the flexible webs described with respect to the roll-to-roll coater. In this type of batch deposition, one or more walls of the plenum may be removed and replaced to coat a number of non-flexible panels. While this is not as efficient as the use of rolled webs, some applications may require coating of non-flexible substrates. The flexible web can be subjected to a particular tension by adjusting the electromagnetic brake force by varying the current to the brake. The deposition gas flow rate, as measured using the static pressure sensors in combination with the venturi temperature sensors, and as controlled by the slide valves, is relatively high. The particular flow rate of deposition gases through the plenum will vary depending on several factors including the dimensions of the plenum, the material being deposited, the carrier gases used, the speed of the web through the plenum and other criteria. For deposition of platinum/silica on copper, a plenum having a 610 mm by 6 mm cross section was used. A typical flow rate for this application is 14,000 liters/min. Obviously other flow rates may be used for this and other applications, the best flow rates being determined through experimentation. While manual controls for the slide valves are usually adequate, they may be controlled by servo motors to vary the pressure profile on-the-fly. The information gathered by the web-scanning inspection system may be used to provide an alarm should unacceptable coating quality be detected, or an automatic shutdown of the roll-to-roll coater may be employed. All of these various sub-routines and the circuitry necessary for carrying them out are considered well within the skill level of a worker in the field of vapor deposition, and further explanation is not deemed necessary.

The roll-to-roll coater described above in reference to FIGS. 1–9 and 19 is particularly adapted for coating foil with hot gases. Accordingly, various devices have been described in respect to this embodiment of the invention that are found advantageous for handling flexible foil which is subject to thermal expansion and contraction when subjected to the hot gases. However, the plenum concept of the present invention is suitable for coating moving webs of more rigid material, such as rolls of sheet metal or certain plastics. The coating material may be carried by flowing gases, such as formed by a flame source (CCVD) or other vapor source, or a liquid coating material may be applied by spray.

In accordance with a further aspect of the invention, an array of moving webs (more than two) are arranged so as to form a multi-sided plenum in which coating takes place along the surfaces of the webs which face inward. The coating material may be in the form of flowing vapor or may be sprayed liquid from a spray device located within the plenum. Illustrated in FIGS. 10 and 11 is an array 1000 of webs 1002 that are arranged in the form of a hexagonal plenum. While six webs 1000 are shown, the number of moving webs 1000 may be as low as two as described in respect to the FIGS. 1–9 embodiment above, to any number consistent with practicality. With three or more moving webs 1002 the entire plenum array 1000 can be formed from the webs 1002 without the need for vapor dams, such as the side dams described above with respect to the FIGS. 1–9 embodiment. The more webs 1002, the more closely the polygonal configuration will approach circular. Even a single moving web may be used to form a plenum in conjunction with stationary side-walls forming the remainder of the plenum. Each web is wound from a feed roll 1004 to an take-up roll 1006. (It is to be understood that the feed roll and the take-up roll could be reversed). A flame source 1008 is shown, in which a precursor chemical solution is burned to produce coating chemicals in vapor form. While the bank of flames 1008 is shown as circular, other configurations may be used. One such example is a centrally located flame that would be pivoted about to direct coating materials at the many substrate walls within the plenum. An exhaust hood 1010 disposed above the plenum array 1000 includes an exhaust fan (not shown) to draw exhaust gases from the top of the plenum array and thereby promote an upward flow of gases through the plenum. As the vaporized coating chemicals produced by the flame source 1008 move upward through the plenum 1000 in the direction of arrows 1012, the deposition chemicals contact the walls of the plenum 1000, i.e., the inwardly-facing surfaces of the webs 1002, and coat these surfaces.

If the plenum 1000 is sufficiently tall (or long), substantially all of the coating chemicals may be expected to contact and coat the interior surfaces of the webs 1002. However, in shorter plenums, which may be more practical, it may be desirable to re-direct the gases toward the walls of the plenum 1000. Shown in FIGS. 10 and particularly 11, and with an enlarged portion shown in FIG. 12, is an air-flow means in the form of an elongated tube 1020 having a plurality of holes 1022. Gas, such as air or nitrogen, is caused to flow downward through the tube 1020 so that it exits the holes, directing gases through the holes 1022 and thereby directing the upwardly flowing gases toward the side-walls of the plenum 1000, whereby a major portion of the deposition chemicals contact and coat the side-walls of the plenum 1000. It should be understood that while the description of the roll-to-roll coater 10 and the plenum 1000 have been discussed with the webs traveling in a vertical direction, other configurations are possible. The plenum may be horizontal, with the axes of the supply and take-up rollers being at right angles to the deposition material flow. Deposition material may also flow in several different directions, with the main thrust of the invention (as previously described) being the formation of a plenum wherein the majority of the interior walls of the plenum are in the form of substrate surfaces to be coated. Obviously a vertical flow of deposition material is aided by the inherent thermal updraft of heat activated precursors.

Illustrated in FIG. 13 is a mechanical baffle 1030 in the shape of a dome and supported from above by strut 1032 disposed axially within the plenum 1000 for directing flowing gases outward toward the inwardly facing surfaces of the webs 1002. Baffle 1030 is preferably shaped similar to the internal walls of the plenum (six sided in the example of FIGS. 10 and 11). Strut 1032 may be moveable to position baffle 1030 in different portions of the plenum, or baffle 1030 may be elongated to provide a smaller space over a longer distance, thereby depositing more coating material onto the webs 1002.

While the apparatus in FIG. 11 shows a flame source for producing chemicals for vapor deposition by combustion, a chemical vapor deposition could be provided by other methods. For example, if the webs 1002 are sheet metal, the webs could be heated as they move vertically by an external heater 1001 and vaporized precursor chemicals directed through the plenum 1000. When the precursor chemicals contact the heated side-walls, they decompose, forming the coating on the inwardly facing surfaces of the upwardly moving webs 1002.

In some cases, the coating material need not be in vaporized form. Illustrated in FIG. 14 is a plenum 1000 of moving webs 1002. Disposed centrally within the array 1000 is a fluid conduit 1040 having at its end a rotating device carrying a plurality of spray nozzles 1042 directing sprays 1044 of liquid coating material toward the inwardly facing surfaces of the webs. In this manner, a plurality of webs may be simultaneously coated. Because the moving webs 1002 in this example are disposed in a vertical orientation, the effects of gravity on the sprays 1044 in all lateral directions is the same, whereby uniform coating of the moving array 1000 of webs 1002 is achieved. The sprayed coating material may be a paint, an adhesive, such as an epoxy adhesive, etc.

Other spray directing means are illustrated in FIGS. 15–18. FIG. 15 shows a variation of the spray nozzles 1042 of FIG. 14, wherein spray nozzles 1500 are at an angle so as to use the force of sprays 1502 to rotate the central tube 1504 along with the nozzles 1500. In FIG. 16, a central supply tube 1600 directs a liquid spray downward onto a deflection plate 1602. The spray is deflected by plate 1602 outwardly toward the webs or substrates 1002. In FIG. 17 an alternative deflector is shown in the form of a conical deflector 1700. The conical deflector 1700 directs more of the material outwardly (as opposed to upwardly) thereby increasing deposition efficiency. In FIG. 18, a fan-type of deflector 1800 is illustrated. Fan 1800 has a plurality of blades 1802 that direct the spray outwardly as shown by arrows 1804. The force of the spray also turns the fan 1800 (similar to a sprinkler system), thereby more evenly distributing the sprayed deposition materials to the substrates walls.

Figure 20:
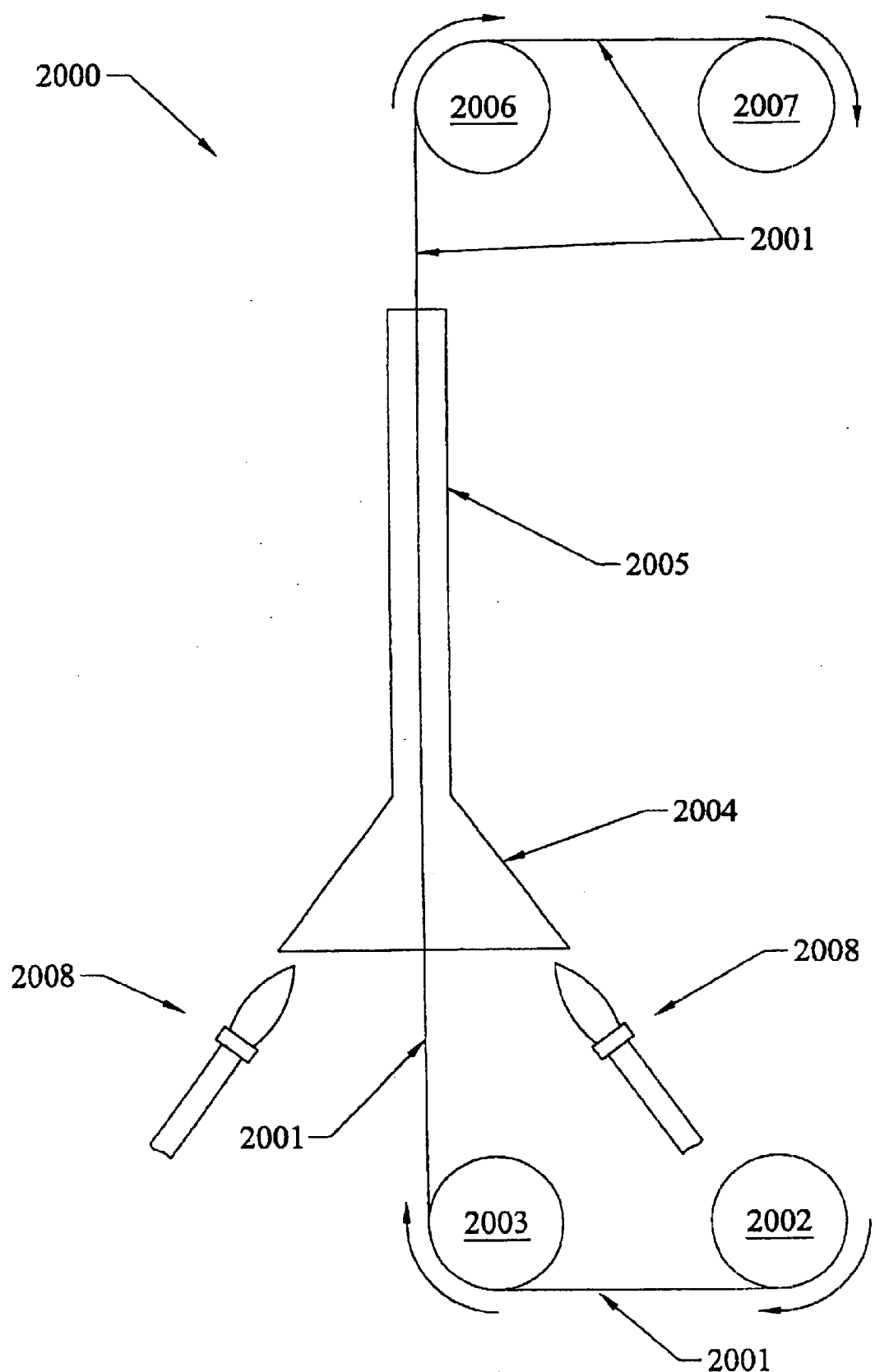
FIG. 20 is a schematic view of a continuous feed wire/tape coater of the present invention.

FIG. 20 illustrates a further embodiment of the continuous feed coater wherein an apparatus 2000 is adapted to coat a wire or tape using CCVD or any other suitable vapor deposition process. The wire or tape 2001 is fed from a supply reel 2002 to a bottom guide reel 2003 and then upward through funnel 2004 and tube 2005. The wire or tape 2001 is then guided around top guide reel 2006 and onto take-up reel 2007. At the bottom of funnel 2004, CCVD nozzles 2008 provide a vaporized coating material source for producing a coating on the wire or tape 2001. While two CCVD 2008 nozzles are shown, this should be understood as exemplary and any number of nozzles may be used depending on the rate of deposition desired. Furthermore, the apparatus 2000 can be used with other vapor deposition sources as well, although sources producing heated deposition gasses are best suited, to take advantage of the upward convection effect produced by tube 2005. This upward convection effect carries the deposition gasses upwardly through the tube 2005, while maintaining a relatively constant temperature inside the tube 2005 from top to bottom. The constant temperature results in the wire or tape 2001 receiving a long exposure to deposition gasses at the ideal deposition temperature. Not only does this result in an efficient deposition process, but also reduces the chance of grains or particles forming that can reduce the quality of the coating. Two or more wire or tape strands may be guided through the tube simultaneously, to further increase the efficiency of the apparatus 2000. Apparatus 2000 has been shown to produce excellent coatings of silica on superconducting tapes having a silver outer coating. These coatings are much thinner than prior art coatings (several microns as opposed to as thick as a mil in prior art coatings), while still providing the same degree of electrical insulation. By providing thinner coatings the tape can be used to form superconducting coils with more turns per cross sectional area, thus increasing the magnetic field produced by these coils.

While the invention has been described with respect to certain preferred embodiments, modifications that would be obvious to one with ordinary skill in the art may be made without departing from the scope of the invention. For example, when the material being coated is a foil, a plurality of blades may be disposed between the top of the chimney and a plurality of parallel take-up rolls, whereby rolls of coated material of a desired size may be provided. Likewise, instead of take-up rolls, the coated web material may be directly taken up by downstream processing apparatus as previously described, which, for purposes of the invention, are considered the equivalent of take-up rolls.

The overall dimensions (height, width, length) of the continuous feed coater can be designed to handle the required substrate dimensions. The substrate dimensions are dependent on the particular application and field of use. For forming platinum/silica coatings on copper foil substrates in the field of embedded resistors for electronic printed wiring boards, the width of the foil varies from 610 mm to 737 mm, and even may be as large as 1220 mm. The width of the roll-to-roll coater would of course have to be slightly longer to accommodate handling of the foil.

EXAMPLE

In this example, a platinum/silica coating was formed on two sheets of copper foil to make electrically resistive layers on conductive substrates. The roll-to-roll coater described above was used to form the coatings. A solution containing 40 grams of Pt (II) cychooctadiene, 8 grams of dodecylamine, 27 grams of tetraethyl orthosilicate (TEOS), 750 grams of toluene and 4455 grams of propane was fed to the two CCVD nozzles with a flow rate of approximately 4.85 cc/min per nozzle. Approximately 3.15 amps of current was supplied to the resistively heated atomizers of the CCVD nozzles as was 4.1 liters/min. of tip oxygen. Redirect air was supplied to the central redirect at 43 liters/min. The CCVD nozzles were scanned across the width of the plenum at an average speed of 5 meters/min. The copper foil was fed through the plenum at 21.6 mm/min. The temperature within the plenum was maintained at approximately 90° C., as the flow rate of gas through the plenum had an approximate speed of 14,000 liters/min. The deposition was continued for 5 hours and 32 minutes to coat two 7.2 meter lengths of copper with approximately 90 nanometer thick resistive layers.

It is to be understood that the terminology used herein is for the purpose of describing particular embodiments only and is not intended to be limiting. It must be noted that, as used in the specification and the appended claims, the singular forms "a," "an" and "the" include plural referents unless the context clearly dictates otherwise.

Throughout this application, where publications are referenced, the disclosures of these publications in their entireties are hereby incorporated by reference into this application in order to more fully describe the state of the art to which this invention pertains.

What is claimed is:

1. An apparatus for coating two substrates in the form of two rolled webs of material, said apparatus comprising:
   two supply means for supplying and supporting respective uncoated portions of the web substrates;
   two web-handling portions for guiding the respective web substrates through a coating area, the web substrates being proximal to one another in said coating area to form a deposition plenum;
   two take-up means for supporting respective coated portions of the web substrates and for driving the respective web substrates from the supply rollers through the coating area and onto their respective take-up means; and
   a coating material source for providing coating material to the deposition plenum;
   wherein, the webs are oriented vertically within said deposition plenum, said coating material source is located at the bottom of the deposition plenum, and said apparatus includes a exhaust system at the top of the deposition plenum, such that the coating material flows between the two webs from the bottom of the deposition plenum to the top of the deposition plenum; and
   wherein said two web-handling portions each include a plurality of arch bars, each of said arch bars supporting the respective webs along a horizontal line, thereby forming bends in the respective webs, wherein the coating material is redirected as it flows past the bends forming turbulence regions within the deposition plenum.

2. The apparatus according to claim 1, wherein:
   each of said arch bars on one of said web-handling portions is associated with an arch bar on the other of said web handling portions such that said arch bars are aligned in pairs;
   uppermost and lowermost pairs of arch bars are separated by a first distance;
   central pairs of said arch bars are separated by a second distance, said second distance being less than said first distance; and
   pairs of said arch bars between said central pairs of said arch bars and said uppermost and said lowermost pairs of arch bars are separated by a third distance, said third distance being greater than said second distance and less than said first distance.

3. The apparatus according to claim 2, wherein each of said arch bars includes a plurality of holes along the horizontal line, said holes providing pressurized gas between each arch bar and the respective web, thereby forming a low-friction air bearing.

4. The apparatus according to claim 1, wherein said two web-handling portions each include a vacuum chuck, each said vacuum chuck supporting the respective web such that the web is held against the vacuum check so that the respective webs will not wrinkle as they travel through the deposition plenum.

5. The apparatus according to claim 1, wherein said exhaust system has a width parallel to a width of the webs, said exhaust system including a plurality of runners spaced across the width of the plenum, each said runner comprising:
   a venturi; and
   a slide valve within said venturi, said slide valve being adjustable to vary the amount of the coating material that flows through said venturi, such that the differential pressure across the width of said deposition plenum can be controlled to provide a more uniform coating on the webs.

6. The apparatus according to claim 5, wherein each of said runners further comprises a runner static pressure sensor within said venturi.

7. The apparatus according to claim 6, wherein each of said runners further comprises a runner temperature sensor within said venturi.

8. The apparatus according to claim 7, wherein said exhaust system further comprises a exhaust system static pressure sensor, said runner static pressure sensors, said runner temperature sensors, and said exhaust system static pressure sensor providing feedback for the control of said slide valves.

9. An apparatus for coating two substrates in the form of two rolled webs of material, said apparatus comprising:
- two supply means for supplying and supporting respective uncoated portions of the web substrates;
- two web-handling portions for guiding the respective web substrates through a coating area, the web substrates being proximal to one another in said coating area to form a deposition plenum;
- two take-up means for supporting respective coated portions of the web substrates and for driving the respective web substrates from the supply rollers through the coating area and onto their respective take-up means; and
- a coating material source for providing coating material to the deposition plenum;
- a frame, said frame including a first and a second side plate attached to each other by a number of cross bars; and
- four legs, two of said legs supporting said first side plate and the other two of said legs supporting said second side plate; wherein
- said two supply means, said two web-handling portions, and said two take-up means are attached to and supported by said first and second side plates.

10. The apparatus according to claim 9 wherein each of said two supply means and said two take-up means are rollers that are rotatably attached to said first and second side plates using a first and second adjustment mechanism, one on each end of said rollers, such that the adjustment mechanisms can adjust a distance between the ends of said rollers and an outer edge of the respective side plate to adjust for skewing of the web.

11. The apparatus according to claim 10 wherein each said adjustment mechanisms comprises:
- a ledge attached to said outer edge of the respective side plate;
- a bearing block slidably mounted on top of said ledge; and
- a threaded fastener mounted in a threaded bore in said outer edge of said respective side plate, said threaded fastener including an end abutting said bearing block;
- wherein screwing said threaded fastener into and out of said threaded bore adjusts the distance between said bearing block and said outer edge of said respective side plate to adjust for the skewing of the web.

12. The apparatus according to claim 1 further comprising two web temperature controllers for adjusting the temperature of the webs prior to entering the deposition plenum.

13. The apparatus according to claim 12 wherein said two web temperature controllers each comprise a pre-heater.

14. The apparatus according to claim 12 wherein said two web temperature controllers each comprise a pre-cooler.

15. The apparatus according to claim 1 wherein said take-up means comprises driven take-up rollers and said apparatus further comprises two slip-sheet rollers for supplying a slip-sheet to said driven take-up rollers, the slip-sheet being wound around said driven take-up rollers between adjacent layers of the coated web substrate.

16. The apparatus according to claim 1 wherein said two web-handling portions both include an upper and a lower tangent roller for guiding the respective web substrates, the web substrates being routed from said two supply means around said lower tangent rollers, through said deposition plenum, around the upper tangent rollers and onto said take-up means.

17. The apparatus according to claim 16 wherein said upper and lower tangent rollers are rotatably mounted to first and second side plates.

18. The apparatus according to claim 16 wherein said upper and lower tangent rollers include a plurality of holes, said holes providing pressurized gas between said upper and lower tangent rollers and the respective web thereby forming a low-friction air bearing.

19. The apparatus according to claim 16 wherein said two web-handling portions both include a feed roller, said feed rollers being located below and between said lower tangent rollers and said supply means, said respective webs being routed from said supply means about said feed rollers and to said lower tangent rollers, thereby forming a tent-shaped inlet area for routing the coating material into the deposition plenum.

20. The apparatus according to claim 19 wherein said feed rollers are rotatably mounted to first and second side plates.

21. The apparatus according to claim 19 wherein said feed rollers include a plurality of holes, said holes providing pressurized gas between said feed rollers and the respective web, thereby forming a low-friction air bearing.

22. The apparatus according to claim 19 wherein said tent-shaped inlet area includes first and second lower side dams for routing the vaporized coating material into the deposition plenum.

23. An apparatus for coating two substrates in the form of two rolled webs of material, said apparatus comprising:
- two supply means for supplying and supporting respective uncoated portions of the web substrates;
- two web-handling portions for guiding the respective web substrates through a coating area, the web substrates being proximal to one another in said coating area to form a deposition plenum;
- two take-up means for supporting respective coated portions of the web substrates and for driving the respective web substrates from the supply rollers through the coating area and onto their respective take-up means; and
- a coating material source for providing coating material to the deposition plenum;
- wherein the deposition plenum further comprises first and second side air dams for keeping the coating material between the two webs, the first and second side air dams and the two webs thereby forming four innermost walls of the deposition plenum.

24. The apparatus according to claim 1 wherein said coating material source comprises a bubbler from which said coating material is vaporized.

25. The apparatus according to claim 1 wherein said coating material source comprises a sublimer from which said coating material is vaporized.

26. The apparatus according to claim 1 wherein said coating material source comprises a vaporizer.

27. The apparatus according to claim 1 wherein said coating material source comprises a nebulizer.

28. The apparatus according to claim 1 wherein said coating material source comprises at least one combustion vapor deposition nozzle.

29. The apparatus according to claim 28 wherein said coating material source comprises at least two combustion chemical vapor deposition nozzles.

30. The apparatus according to claim 29 wherein said coating material source further comprises a gas jet.

31. The apparatus according to claim 29 wherein said at least two combustion chemical vapor deposition nozzles are directed upward and toward one another at a particular angle and said gas jet is directed upward and midway between said two combustion chemical vapor deposition nozzles to thereby direct said vaporized coating material into said deposition plenum.

32. The apparatus according to claim 28 wherein said coating material source further comprises:
- a support plate, said at least one chemical vapor deposition nozzle being mounted on said support plate;
- an isolation plate, said isolation plate being mounted above said at least one chemical vapor deposition nozzle and including a centrally located opening for the vaporized coating material to enter the deposition plenum therethrough, said at least one chemical vapor deposition nozzle being mounted on directly below said centrally located opening; and
- a traversing mechanism, said support plate and said isolation plate being mounted on said traversing mechanism; wherein said traversing mechanism moves said support plate, said at least one chemical vapor deposition nozzle and said isolation plate back and forth across the width of the deposition plenum, to thereby distribute the vaporized coating material evenly across the webs.

33. The apparatus according to claim 32 wherein said coating material source comprises at least two combustion chemical vapor deposition nozzles.

34. The apparatus according to claim 33 wherein said coating material source further comprises a gas jet, said gas jet being mounted on said support plate.

35. The apparatus according to claim 34 wherein said at least two combustion chemical vapor deposition nozzles are directed upward and toward one another at a particular angle and said gas jet is directed upward and midway between said chemical vapor deposition nozzles to thereby direct said vaporized coating material through said centrally located opening and into said deposition plenum.

36. The apparatus according to claim 35 wherein said at least two chemical vapor deposition nozzles and said gas jet are supplied their respective deposition precursors and other gasses via flexible supply tubes, said flexible supply tubes being surrounded by a flexible conduit to protect the flexible supply tubes as the traversing mechanism moves said support plate, said at least one chemical vapor deposition nozzle, said gas jet, and said isolation plate back and forth.

37. The apparatus according to claim 36 further comprising a web-scanning inspection system, said inspection system scanning the width of both webs after the webs have left the deposition plenum and prior to said webs being taken up by said take-up means.

38. The apparatus according to claim 37 wherein said web-scanning inspection system includes:
- a first track and a second track; and
- a first inspection shuttle mounted on said first track and a second inspection shuttle mounted on said second track; wherein
- said first and said second inspection shuttles travel back and forth along their respective tracks across the width of their respective web; and
- said first and second shuttles include instruments that inspect the coating on the webs for at least one of the following properties: depth of the coating; epitaxial nature of the coating; and smoothness of the coating.

39. The apparatus according to claim 1 further comprising:
- web speed indicating means;
- coating material flow rate indicating means;
- two drive means for driving said two take-up means, said drive means being controlled by associated drive control circuitry;
- coating material flow control circuitry;
- web inspection means; and
- a computer-based control system; wherein
- said computer-based control system receives signals from said web speed indicating means, said coating material flow rate indicating means, and said web inspection means, and provides control signals to said drive control circuitry and said coating material flow control circuitry, based on these signals.

40. The apparatus according to claim 39 wherein:
- said coating material source further comprises at least one chemical vapor deposition nozzle, a support plate, said at least one combustion chemical vapor deposition nozzle being mounted on said support plate, an isolation plate, said isolation plate being mounted above said at least one chemical vapor deposition nozzle and including a centrally located opening for the vaporized coating material to enter the deposition plenum therethrough, said at least one chemical vapor deposition nozzle being mounted directly below said centrally located opening, and a traversing mechanism having a traversing motor, said support plate and said isolation plate being mounted on said traversing mechanism, said traversing mechanism moves said support plate, said at least one chemical vapor deposition nozzle and said isolation plate back and forth across the width of the deposition plenum, to thereby distribute the vaporized coating material evenly across the webs; and
- said computer-based control system controls the traversing motor to thereby control the rate at which said support plate, said at least one chemical vapor deposition nozzle and said isolation plate back and forth across the width of the deposition plenum.

41. An apparatus for coating a substrate in the form of a rolled web of material, said apparatus comprising:
- a supply means for supplying and supporting uncoated portions of the web substrate;
- a web-handling portion for guiding the web substrate through a coating area, the web substrate being adjacent a surface in said coating area to form a deposition plenum;
- a take-up means for supporting coated portions of the web substrate and for driving the web substrate from the supply roller through the coating area and onto said driven take-up roller; and
- a coating material source for providing coating material to the deposition plenum;
- wherein said supply means is below said take-up means, such that the web is substantially vertical while in said deposition plenum; and
- wherein the web substrate converges toward said surface incrementally from a bottom of said deposition plenum to a central region of said deposition plenum, and diverges incrementally from said central region of said deposition plenum to a top of said deposition plenum thereby forming a central venturi region within said deposition plenum.

* * * * *